United States Patent
McRay et al.

(10) Patent No.: US 7,740,247 B2
(45) Date of Patent: Jun. 22, 2010

(54) COMPOUND SLIDING SEAL UNIT SUITABLE FOR ATMOSPHERE TO VACUUM APPLICATIONS

(75) Inventors: Richard F. McRay, Salem, MA (US); Nicholas R. White, Manchester, MA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 26 days.

(21) Appl. No.: 12/283,183

(22) Filed: Nov. 10, 2008

(65) Prior Publication Data
US 2009/0066031 A1      Mar. 12, 2009

Related U.S. Application Data

(63) Continuation-in-part of application No. 11/209,484, filed on Aug. 22, 2005, now Pat. No. 7,462,843, which is a continuation of application No. 11/123,924, filed on May 6, 2005, now Pat. No. 7,112,789.

(51) Int. Cl.
*F16J 51/02* (2006.01)
*F16K 3/28* (2006.01)
*G03B 27/64* (2006.01)

(52) U.S. Cl. .................. 277/345; 277/913; 277/911; 355/76; 451/289; 250/492.21; 250/440.11; 250/433

(58) Field of Classification Search .................. 277/345, 277/913, 911; 355/76; 451/289; 250/492.21, 250/440.11, 433
See application file for complete search history.

(56) References Cited

U.S. PATENT DOCUMENTS

| 6,080,046 A * | 6/2000 | Shendon et al. ............... 451/54 |
| 6,421,112 B1 * | 7/2002 | Bisschops et al. ............. 355/53 |
| 6,618,122 B2 * | 9/2003 | Bisschops et al. ............. 355/72 |
| 6,854,708 B2 * | 2/2005 | Contin et al. ............... 251/167 |

* cited by examiner

*Primary Examiner*—Nikita Wells

(57) ABSTRACT

The present invention is a compound sliding seal unit of markedly reduced size and height dimensions which is employed as a discrete assembly for both the passage across and the at-will height adjustment of a mounted, rotatable shaft which extends from the atmospheric environment portion into the vacuum environmental portion of an ion implanter apparatus. The extended, rotatable shaft is typically fashioned as either a rotatable hollow tube or conduit (suitable for the passage of electrical components) and/or as a rotatable support suitable for the mounting of a pivotal scanning radial arm translation system. The manner of construction and the substantially reduced height dimensions of the compound sliding seal unit permits on-demand changes of height for the mounted, rotatable shaft which extends from the atmospheric environment and extends through the compound unit into the confined and limited spatial volume of a vacuum environment within a conventional ion implantation apparatus. The compound unit also allows the user to maintain a high vacuum within the vacuum environment despite the fact that the height of the feed-through member can be raised and lowered repeatedly at will. Its compact size frees space which can be used to extend the vacuum chamber for purposes such as a deep Faraday cup for beam measurement.

21 Claims, 14 Drawing Sheets

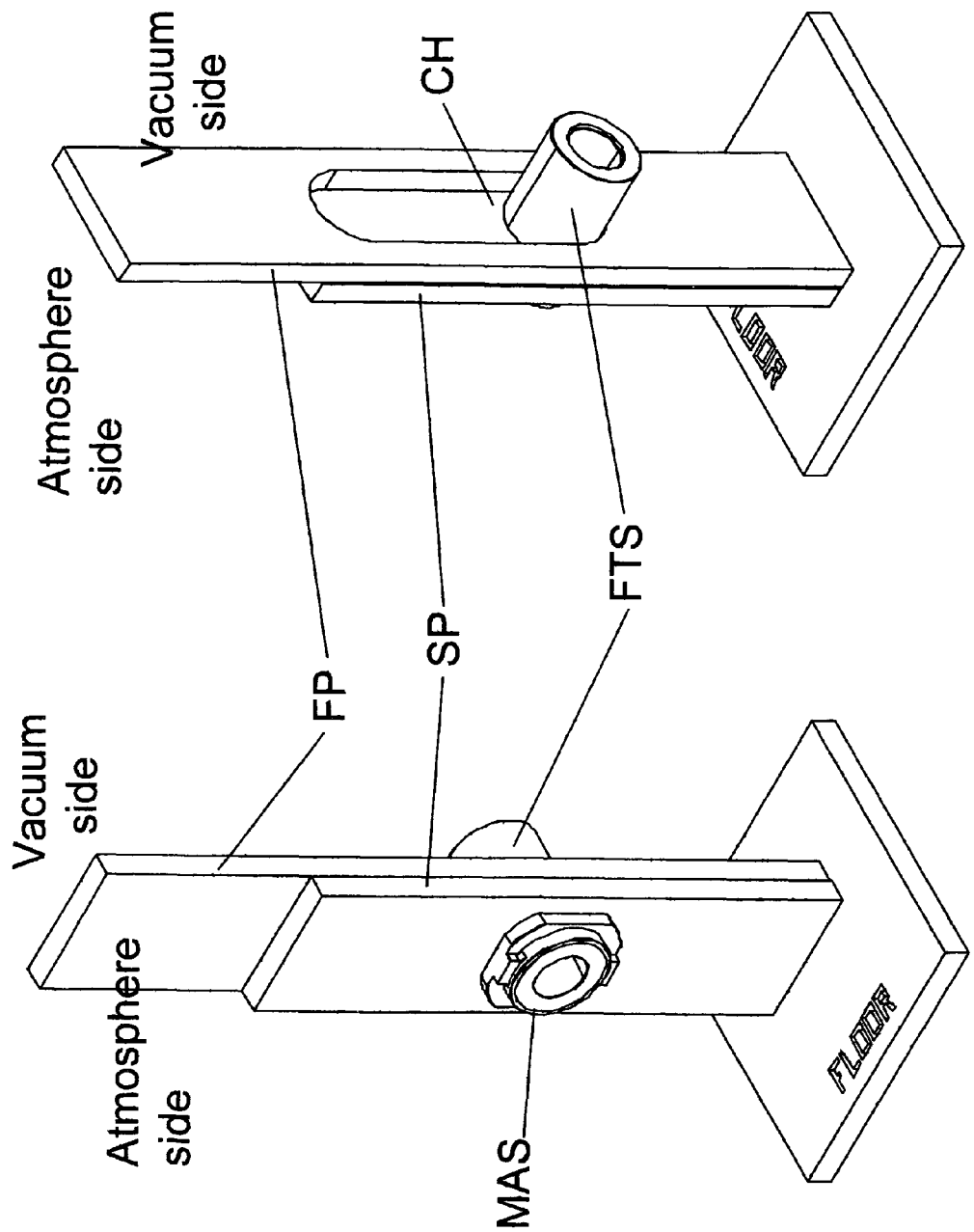

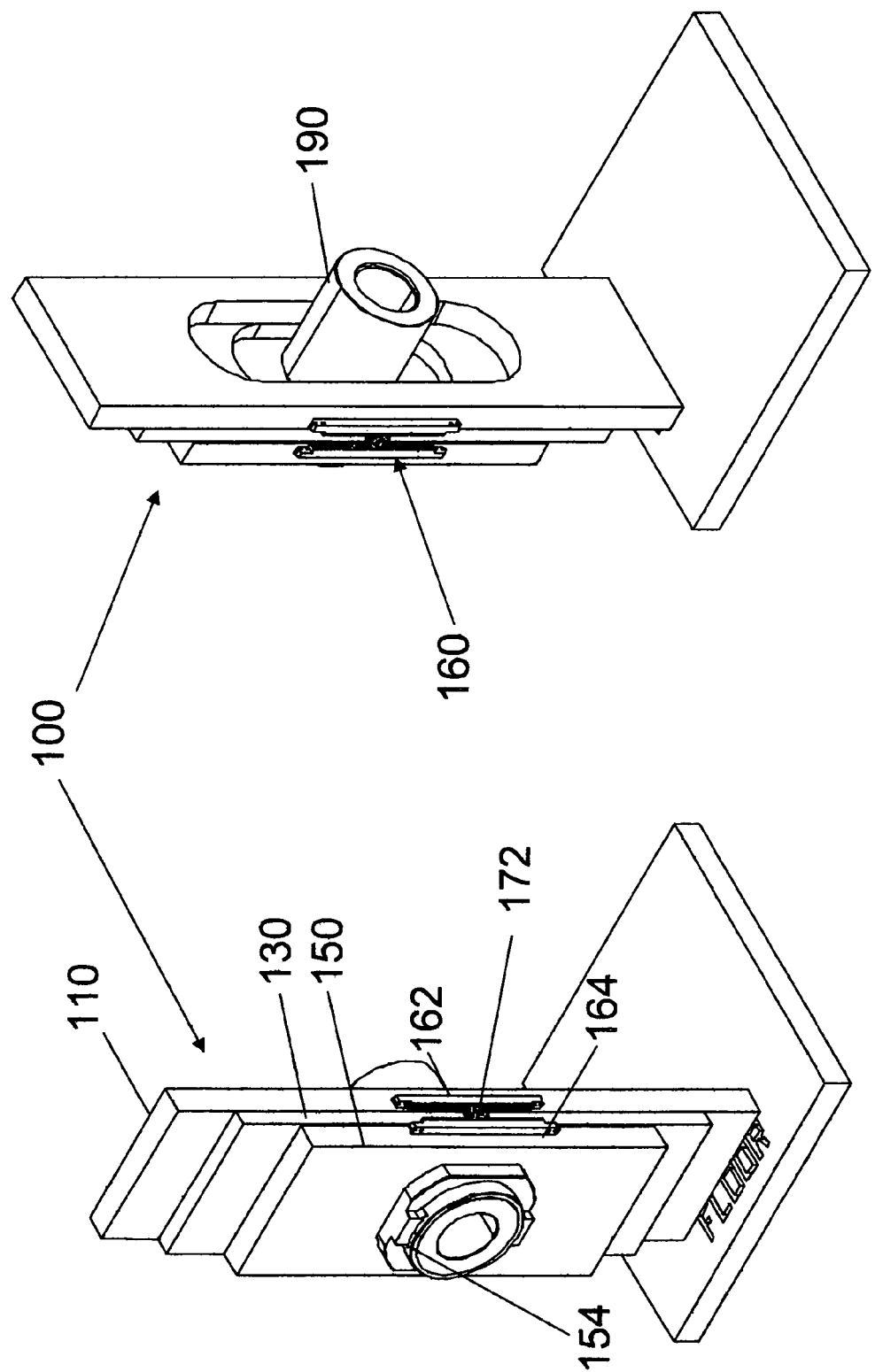

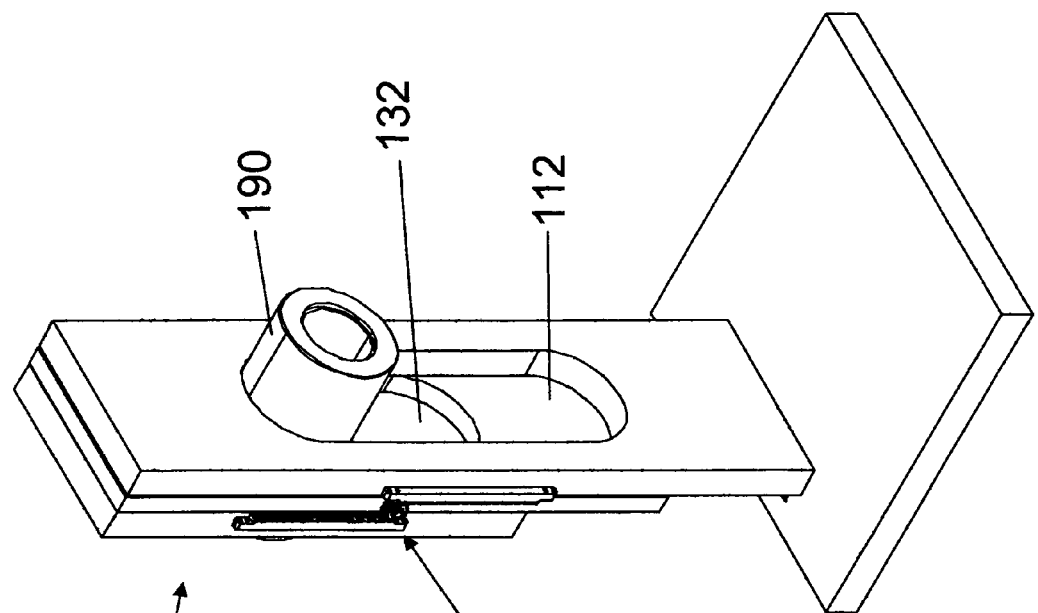
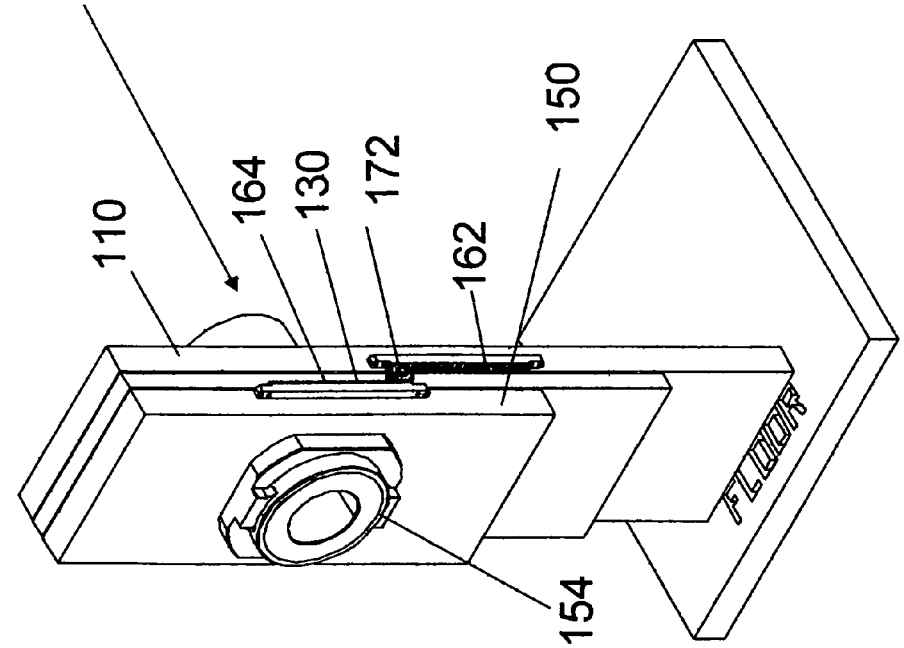
Fig. 8a
Fig. 8b

COMPOUND SLIDING SEAL UNIT SUITABLE FOR ATMOSPHERE TO VACUUM APPLICATIONS

CROSS-REFERENCES & PRIORITY CLAIM

This application is a Continuation-In-Part of U.S. patent application Ser. No. 11/209,484, filed on Aug. 22, 2005 now U.S. Pat. No. 7,462,843, entitled "Apparatus and Methods for Ion Beam Implantation", now pending; which is a Continuation of U.S. patent application Ser. No. 11/123,924, filed on May 6, 2005, now U.S. Pat. No. 7,112,789. The legal priority of these previously filed applications is expressly claimed; and each of these previously filed applications, in its entirety, is expressly incorporated by reference herein.

FIELD OF THE INVENTION

The present invention relates generally to apparatus for performing ion implantation; and is directed to an improved compound sliding seal unit suitable for use in the vacuum conditions implantation apparatus and methods for performing a high/medium current ion implantation at different ion energies.

BACKGROUND OF THE INVENTION

Ion implantation is a ballistic process used to introduce specific ion species, atoms or molecules referred to generally as dopants, into a prechosen target substrate to make materials having many useful properties. Of particular interest today, ion implantation is a conventionally known and employed process used for the making of modern integrated circuits. Ion implantation is also commonly used for large sized substrates to manufacture optical or display devices such as flat panel displays having a controlled film thickness and predefined surface properties.

Prior Art Ion Implantation Apparatus and Systems

A conventional batch ion implantation apparatus and system, representing a type which has been manufactured and sold generally for about 30 years, is illustrated by Prior Art FIG. 1. As shown therein, the implantation system comprises an ion beam source (14) that provides a traveling ion beam (13). The traveling beam is directed to make reactive contact with a batch of prechosen circular target substrates (10), each of which is mounted on a disk-shaped target substrate holder (11). All of these individual items, however, must be enclosed and remain contained within a discrete vacuum housing or chamber, which does not appear within the illustration.

Prior Art FIG. 1 also shows that the disk-shaped substrate holder (11) is rotated about a central pivot and rotation axis (12), which preferably lies parallel to the trajectory of the traveling ion beam (13); and that the rotational axis (12) is spaced apart, or horizontally translated, from the ion beam (13) such that the positional distance "R" existing between the rotation axis and the traveling ion beam may be either increased or decreased at will. Variation of the positional distance "R" allows the traveling ion beam to make reactive contact with each of the target substrates (10). Also, in order to introduce a single, uniform dose of ions into each target substrate, the translation velocity is controlled to be inversely proportional to the measured distance "R".

In certain ion implantation applications, particularly those using wide wafers or large substrates which are 300 mm or greater in size as the implantation target, it is advantageous to generate traveling ion beams which appear as ribbon-shaped beams having a high aspect ratios (i.e., where the cross-section of the beam is much larger in one dimension than the other). Such high aspect ratio ribbon beams are commonly used in ion implanter apparatus and implantation systems where a single workpiece (such as a silicon wafer or flat panel display) is moved in a single dimension across the traveling ion beam. In these instances, the cross-sectional format of the ribbon ion beam typically has one dimension that is larger than one dimension of the workpiece undergoing implantation; and consequently as a result a uniform dose of ions of having a high aspect pattern may be implanted into the material of the individual workpiece by one or more complete passes at a constant speed through the ion beam.

In these kinds of implantation systems, it is very desirable that the trajectories of the ion species constituting the ribbon beam as a whole travel in parallel, and also be under careful trajectory control, in order to present a uniform current density profile that is appropriate and proper for the implantation of ions into the prechosen substrates (such as semiconductor wafers or flat glass panels). It is also preferred that the ribbon beam be substantially free of undesirable ion species that may be initially present in the ion source feed material and/or be intrinsically present within the materials of the ion source itself.

This particular problem, as well as the general state of the art of analyzing and transporting ribbon ion beams within ion implanters is revealed and discussed by the following printed publications: Banford, *The Transport of Charged Particle Beams*, Spon, 1960, which describes a conventionally known format for a multipole lens able to adjust the features of an ion beam; White et al., "The Control of Uniformity in Parallel Ribbon Ion Beams Up to 24 Inches in Size," Applications of Accelerators in Science and Industry 1998, AIP, p. 830, 1999, the entire text of which is expressly incorporated by reference herein; U.S. Pat. Nos. 4,276,477; 4,745,281; 4,922,106; and 5,091,655 which describe techniques for parallel-scanning ion beams; U.S. Pat. No. 4,980,562 which describes means for controlling the uniformity of the ion implant by modifying the shape of the waveform used to scan the beam; U.S. Pat. Nos. 5,350,926 and 5,834,786 which teach the use of magnets and multipoles for analyzing, shaping and rendering more parallel the ion trajectories of a beam, and are commercially represented by the SHC 80, VIISta-80, and VIISta HC ion implantation systems manufactured and sold by Varian Semiconductor Equipment Associates of Gloucester, Mass.; U.S. Pat. No. 5,834,786 which describes apparatus and systems which implant ions into flat panel display substrates using uniform ribbon beams which have been mass analyzed; U.S. Pat. Nos. 6,489,622 and 6,710,358 which offer solutions to the current intensity and trajectory problems commonly encountered when high beam currents are obtained by decelerating the ion beam immediately prior to the target; U.S. Pat. No. 6,933,507 which reveals a method and system for improving the precision of the angle of incidence for ions that impact a semiconductor wafer and of ribbon beams for the uniform doping of wafers; U.S. Pat. No. 7,078,713 describing an electromagnetic regulator assembly for adjusting and controlling the current uniformity of continuous ion beams; and U.S. Pat. No. 7,112,789 which uses a uniquely designed analyzer magnet to purify a ribbon ion beam of high aspect ratio. Each of these printed publications is expressly incorporated by reference herein.

Pivotal Radial Arm Translation of a Targeted Workpiece

Ion implantation apparatus has also been developed for single wafer processing. Recently, there have been examples of high-current ion implanters which mechanically scan a target workpiece in two dimensions through the ion beam. A particular feature of these kinds of systems is their use of a pivoted radial arm assembly to translate or move a prechosen individual workpiece through an ion beam in a first direction, while the pivot of the arm is then used as a means of translating the workpiece back and forth in a second, orthogonal direction—thereby providing for two-dimensional raster mechanical scanning. This unique pivotal radial arm translation assembly and technique is described and illustrated by U.S. Pat. Nos. 7,057,192 and 7,135,691; and these systems are characterized by large mechanisms for rotational scanning and linear translation which occupy considerable space when positioned behind the plane of implantation and at a somewhat displaced distance from the ion beam centerline.

Part of such a pivotal radial arm scanning system is illustrated by Prior Art FIG. 2, which has been reproduced from U.S. Pat. No. 7,135,691. As shown therein, the vertical drive mechanism (280) and the motor housing (226) occupy the particular location and volumetric space where it would be very desirable to place a deep Faraday cup for the purpose of intercepting the ion beam when placed remotely from the implant location, and as part of the system for measuring ion the beam current. Moreover, the quantity of space available in this location for positioning a beam stop within the vacuum environment is also quite limited; an organizational obstacle which makes both dosimetry and the control of workpiece contamination by sputtering very problematic. Accordingly, it would be highly desirable, for purposes of reducing ion cross-contamination and controlling dosimetry, to allow those ions of the traveling beam which bypass the targeted workpiece between the scanning cycles to be intercepted by their striking a beam dump within a deep Faraday cup at a specified spot well behind the ion implantation location.

Attention is therefore directed to the essential information to be derived from the system arrangement of Prior Art FIG. 2, which clearly shows that the traveling ion beam (205) which bypasses the workpiece between scanning cycles has nowhere to go when the workpiece (294) has been swung out of the ion beam's travel axis. Note also that the beam dump (237) fails completely to achieve its intended function by allowing the sputtered particle contaminants to reach all spatial areas of the closed vacuum environment; and as a consequence, because the sputtered particle contaminants have been neither contained nor suppressed, it therefore becomes almost impossible to obtain accurate beam current measurements or to make precise adjustments to either the parallelism or the trajectory of the ion beam as it travels within the vacuum chamber.

The Conventionally Known Sliding Seal

A sliding seal arrangement was first used in about 1980 to translate a spinning disk (of the type shown in Prior Art FIG. 1) through an ion beam, in the NV-10 ion implanter manufactured by Nova Associates Inc. (subsequently Eaton Nova). This sliding seal arrangement is disclosed by Ryding in U.S. Pat. No. 4,229,655. As described therein, and reproduced in part here by Prior Art FIGS. 3A and 3B respectively, three fixed concentric sealing rings (116, 118, 120) each backed by an O-ring (124) are utilized to make a series of nested planar sliding seals; and differential vacuum pumping is provided to the volumetric spaces between the three planar sliding seals in order to minimize the leakage of unwanted atmospheric gases into the high vacuum chamber. It was therefore self-evident for practitioners in this technical field to apply this sliding seal technology to the pivoted radial arm translation systems.

However, in the Ryding apparatus actually described by U.S. Pat. No. 4,229,655, it is noted that the ion beam itself is passed through the sliding seal; and the spindle of the rotating disk is mounted below the Faraday cup. Thus, the vacuum chamber wall moves upon and over the single sliding seal during the time the ion beam is passed through the sliding seal rings and the spindle of the rotating disk was mounted below the Faraday cup. Consequently, the entirety of the self-contained vacuum chamber by necessity is compelled to move on and over the sliding seal. This operational arrangement, however, is neither convenient nor desirable.

Accordingly, in order to utilize and take best advantage of the unique pivotal radial arm translation assembly and technique described by U.S. Pat. Nos. 7,057,192 and 7,135,691 respectively, the conventional Ryding sliding seal assembly was adapted, modified, and then used in an alternative manner and different location immediately adjacent to the pathway of the traveling ion beam. The modified structure of and alternative use format for the Ryding sliding seal assembly is illustrated by Prior Art FIGS. 4A and 4B respectively. As oriented therein, Prior Art FIG. 4A shows the modified assembly as it appears from the atmospheric environment, while Prior Art FIG. 4B shows the modified assembly as it appears from inside the vacuum environment.

As seen therein, the conventional sliding seal assembly is formed of two adjacently positioned plates: one fixed plate (FP) which is to be joined to and becomes part of the vacuum chamber wall; and one sliding plate (SP) which lies against the forward-facing surface of the fixed plate.

As shown by Prior Art FIGS. 4A and 4B, the fixed plate (FP) is the longer of the two plates; has a sausage-shaped open channel (CH) located in its center which is sized to present a void volume of about 33% over the linear length of the fixed plate; and will accommodate the diameter of a hollow feed-through shaft (FTS).

In contrast, the sliding plate (SP) has an overall linear length sufficient to cover, enclose, and seal all of the void volume presented by the sausage-shaped open channel (CH) in the fixed plate. The sliding plate (SP) also provides the means for attaching and supporting (MAS) the hollow feed-through shaft (FTS) as it protrudes through and extends beyond the sausage-shaped opening in the fixed plate. Via this modified structure and organizational arrangement, there is no direct communication pathway between the inside and the outside of the vacuum chamber.

There are, however, several major problems and difficulties with the conventionally modified sliding seal assembly illustrated by Prior Art FIGS. 4A and 4B. These include the following:

(a) When the sliding plate is moved upwards against the fixed plate—and the hollow feed-through pipe is concomitantly elevated to the maximal height allowed by the sausage-shaped open channel within the fixed plate—the upper horizontal edge of the sliding plate then lies extended over the top edge of the slot in the fixed plate by at least half of the overall length dimension of the sliding plate. This event introduces a height clearance requirement for the vacuum chamber itself, which then must be able to accommodate the complete vertical displacement and fully extended height of the sliding plate when placed at its maximal elevation position.

(b) It is highly desirable for the trajectory of the traveling ion beam within the vacuum chamber to be directed to pass over the top of the conventional sliding seal assembly. However, in order to be functional in this setting, there must be sufficient space for the traveling ion beam to pass overhead without interference when the modified sliding seal assembly has been elevated to its maximal height position. This operational requirement places a second demand for even more overhead space within the closed vacuum chamber; or, by necessity, forces the use of a very shallow beam stop within the limited volume of the smaller vacuum chamber, resulting in poor contamination control and poor dosimetry. As a result, in recent single-wafer implanters, it has not been possible for the ion beam trajectory to pass over the top of the sliding seal assembly.

The Continuing Problem

The overall consequence and outcome of this continuing problem has been that the conventionally available types of pivotal radial arm scanning devices and conventional sliding seal assemblies available to date are not an effective nor viable solution for performing serial mode implantation with a high-current, high-uniformity ion beam with low contamination and accurate dose control. There is thus a clear and present need in the art of integrated circuit fabrication to provide a new configuration system which is able to utilize a high current ion beam and offer improved current uniformity without using additional components—while concomitantly reducing the production cost and simplifying the manufacturing process.

In particular, there is a well recognized need for a very compact subassembly for translating a scanning mechanism, for incorporating an atmosphere-to-vacuum feed-through, and for providing a workpiece holder—such that an individual workpiece can be passed repeatedly through a traveling ion beam, and which permits the use of deep Faraday cups of generous dimensions that have been placed in the travel direction of the beam, and which allows for the taking of accurate beam current measurement as well as the suppression of ion specie cross-contamination.

SUMMARY OF THE INVENTION

The present invention provides an atmosphere to vacuum compound sliding seal unit having several different aspects and formats.

A first aspect of the invention is an atmosphere to vacuum compound sliding seal unit comprising:

a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over not less than one half of said limited length dimension;

an intermediate plate positioned adjacent to and slideable on-demand over said forward-facing surface of said fixed inner plate, wherein said slideable intermediate plate has forward-facing and rearward-facing surfaces, prechosen width and thickness dimensions, a length dimension substantially shorter than said limited length dimension of said fixed inner plate, and a centrally disposed cavity zone whose span is substantially less than said span of said open slot in said fixed inner plate;

an outer plate positioned adjacent to and slideable on-demand over said forward-facing surface of said slideable intermediate plate, wherein said slideable outer plate has forward-facing and rearward-facing surfaces, predetermined width and thickness dimensions, a length dimension smaller than said length dimension of said intermediate plate, and a centrally disposed air-tight mounting suitable for the juncture and support of a feed-through member;

a first sliding seal located between said forward-facing surface of said fixed inner plate and said rearward-facing surface of said slideable intermediate plate, said first sliding seal surrounding and hermetically enclosing the perimeter of said open slot in said fixed inner plate;

a second sliding seal located between said forward-facing surface of said slideable intermediate plate and said rearward-facing surface of said slideable outer plate, said second sliding seal surrounding and hermetically enclosing the perimeter said cavity zone in said slideable intermediate plate;

means for raising and lowering said slideable intermediate plate and said slideable outer plate on-demand; and a feed-through member of set dimensions attached to said air-tight mounting of said slideable outer plate, whereby the axial length of said mounted feed-through member extends through said cavity zone of said slideable intermediate plate and said open slot of said fixed inner plate concurrently, and thereby passes from an atmospheric environment into a vacuum environment.

A second aspect of the invention provides an atmosphere to vacuum compound sliding seal unit comprising:

a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over at least one half of said limited length;

a first intermediate plate positioned adjacent to and slideable on-demand over said forward surface of said fixed inner plate, wherein said first slideable intermediate plate has forward-facing and rearward-facing surfaces, prechosen width and thickness dimensions, a length dimension shorter than the limited linear length dimension of said fixed inner plate, and a first centrally disposed cavity zone whose span distance is less than the span of the open slot in said fixed inner plate;

a second intermediate plate positioned adjacent to and slideable on-demand over said forward-facing surface of said first intermediate plate, wherein said second intermediate plate has forward and rearward surfaces, prechosen width and thickness dimensions, a length shorter than said length dimension of said first intermediate plate, and a second centrally disposed cavity zone whose span distance is less than the span distance of the open slot in said first intermediate plate;

an outer plate positioned adjacent to and slideable on-demand over said forward-facing surface of said second slideable intermediate plate, wherein said slideable outer plate has forward-facing and rearward-facing surfaces, predetermined width and thickness dimensions, a length dimension less than the length dimension of said second slideable intermediate plate, and a centrally disposed air-tight mounting suitable for the juncture and support of a feed-through member;

a first sliding seal located between said forward-facing surface of said fixed inner plate and said rearward-facing surface of said first slideable intermediate plate, said first sliding seal surrounding and hermetically enclosing the perimeter of said open slot in said fixed inner plate;

a second sliding seal located between said forward-facing surface of said first slideable intermediate plate and said rearward-facing surface of said second slideable intermediate plate, said second sliding seal surrounding and hermetically enclosing the perimeter of said cavity zone in said first slideable intermediate plate;

a third sliding seal located between said forward-facing surface of said second slideable intermediate plate and said rearward-facing surface of said slideable outer plate, said third sliding seal surrounding and hermetically enclosing the perimeter of said cavity zone in said second slideable intermediate plate;

means for raising and lowering each of said first and said second slideable intermediate plates and said slideable outer plate on demand; and a feed-through member of set dimensions attached to said air-tight mounting of said slideable outer plate, whereby the axial length of said mounted feed-through member extends through said cavity zone of said slideable intermediate plates and said open slot of said fixed inner plate concurrently, and thereby passes from an atmospheric environment into a vacuum environment.

A third aspect of the invention presents an atmosphere to vacuum compound sliding seal unit comprising:

a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over at least one half of said limited length dimension;

at least two discrete intermediate plates individually positioned adjacent to and slideable on-demand over said fixed inner plate, wherein each of said slideable intermediate plates has forward-facing and rearward-facing surfaces, prechosen width and thickness dimensions, a length dimension shorter than the limited length dimension of said fixed inner plate, and a centrally disposed cavity zone whose span distance is less than said open slot in said fixed inner plate;

an outer plate positioned adjacent to and slideable on-demand over a forward facing surface of the last of said discrete slideable intermediate plates, wherein said slideable outer plate has forward and rearward facing surfaces, predetermined width and thickness dimensions, a length dimension less than the smallest length dimension of said slideable intermediate plates, and a centrally disposed air-tight mounting suitable for the juncture and support of a feed-through member;

a first sliding seal located between said forward-facing surface of said fixed inner plate said rearward-facing surface of the most rearwardly placed of said slideable intermediate plates, said first sliding seal surrounding and air-tight enclosing the perimeter of said open slot in said fixed inner plate;

a plurality of additional sliding seals which are singly located between said forward-facing surfaces of each of said slideable intermediate plates and said rearward-facing surfaces of adjacent plates up to and including said slideable outer plate, wherein each of said additional sliding seals surrounds and hermetically encloses the individual perimeter of each said cavity zone in each of said slideable intermediate plates;

means for raising and lowering each of said slideable intermediate plates and said slideable outer plate on-demand; and a feed-through member of set dimensions attached to said air-tight mounting of said slideable outer plate, whereby the axial length of said mounted feed-through member extends through each of said cavity zones in said slideable intermediate plates and said open slot of said fixed inner plate concurrently, and thereby passes from an atmospheric environment into a vacuum environment.

A fourth aspect of the invention is a unitary sliding seal arrangement suitable for use between a region of high pressure and a region of vacuum, said unitary sliding seal arrangement comprising:

a preformed sealant article formed of slightly flexible, low friction material having good sealing and wear-resistance properties which can be interposed between a first plate and a second plate that can be moved relative to one another; which will encompass a feed-through member then extending through said plates from the region of high pressure to the region of vacuum; and which can be nested in a recess on a surface of the first plate so that the sealant article bears against a surface of the second plate, wherein said sealant article (i) incorporates a plurality of annular flat sealing surfaces between each of which a recess is provided, said recess being suitable for alignment with a port for connection to a source of differential pumping, (ii) incorporates a flexible bridge across each recess and allows each of the annular sealing surfaces some independence of motion when sliding over such imperfections and deviations as then exist upon the surface of the second plate, and (iii) is urged against the second plate to form a plurality of substantially air-tight closures by means of each said annular flat sealing surface, (iv) allows said source of differential pumping to be applied between each said air-tight closure, and thereby allows reliable effective dynamic sealing between atmospheric pressure and high vacuum between surfaces in relative motion.

BRIEF DESCRIPTION OF THE DRAWINGS

The present invention may be more easily understood and better appreciated when taken in conjunction with the accompanying drawings, in which:

Prior Art

Prior Art

Prior Art FIG. 3a is a conventionally known sliding seal mechanism with differential pumping, in which a target chamber (not shown) incorporating a plate moving on rails, with sliding seals, as shown, as taught by Ryding;

Prior Art FIG. 3b is a cross section through the sliding seals of FIG. 3a;

Prior Art FIGS. 4A and 4B are perspective views of a conventionally known sliding seal assembly as seen from outside and from inside the vacuum chamber;

FIGS. 7A and 7B are perspective views of the compound sliding seal unit in a middle height position as seen from outside and from inside the vacuum chamber;

FIGS. 8A and 8B are perspective views of the compound sliding seal unit in the maximum height position as seen from outside and from inside the vacuum chamber;

DETAILED DESCRIPTION OF THE INVENTION

Figure 1:
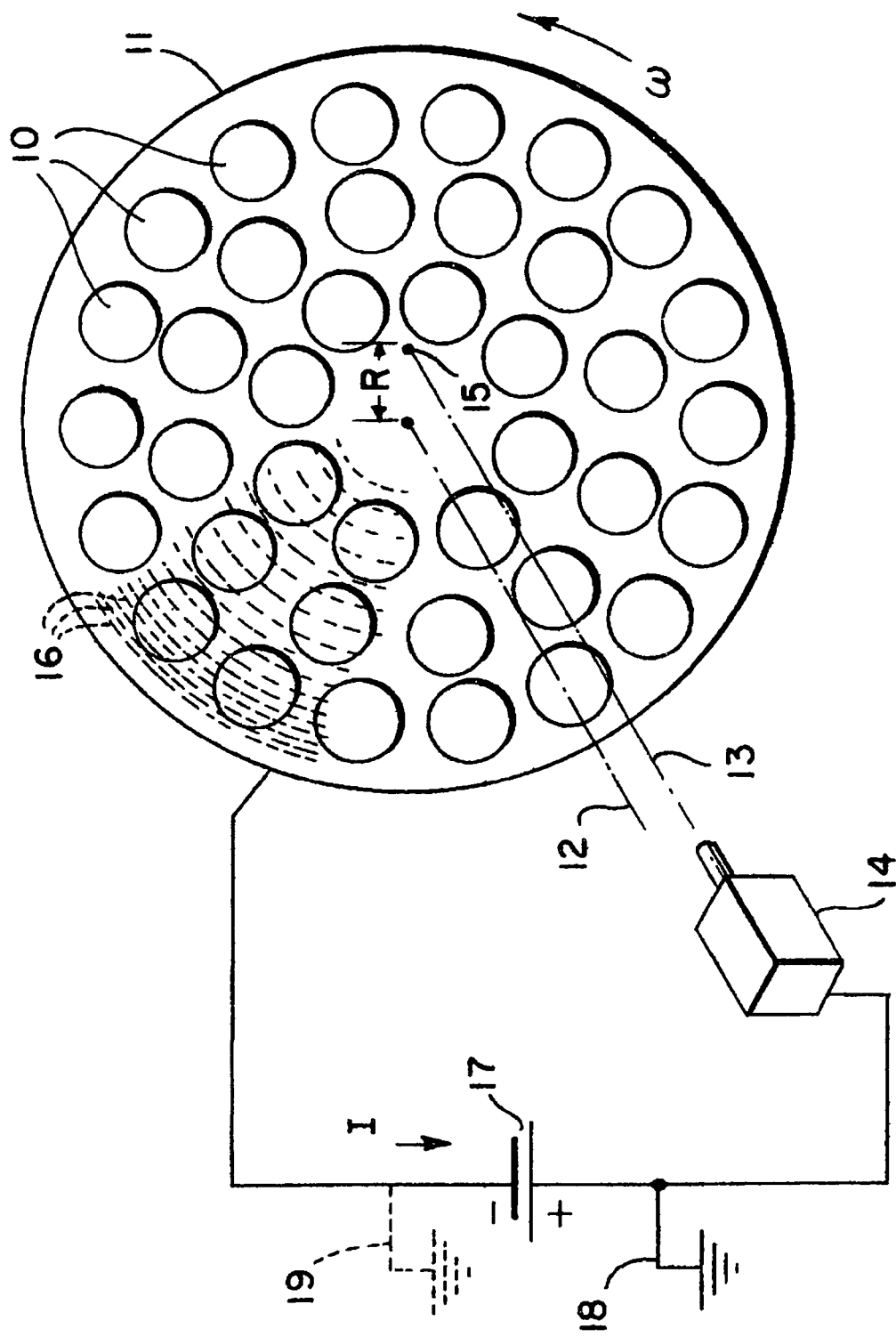
FIG. 1 is a functional block diagram of a conventional prior art batch ion implantation system in which a spinning disk holding implantation targets provides one dimension of motion, and translation of the disk provides a second dimension.

The present invention is a compound sliding seal unit of markedly reduced height dimensions and overall size which is employed as a discrete subassembly for both the passage across and the at-will height adjustment of a mounted, optionally rotatable, rod-like member (or spindle) which passes through and extends from the atmospheric environment portion into the vacuum environmental portion of an ion implanter apparatus. The extended, optionally rotatable, rod-like member or spindle is typically fashioned as either a hollow tube or shaft (suitable for the passage of electrical components) and/or as a rotatable support bar or appendage (suitable for the mounting of a pivotal scanning radial arm translation system).

The manner of its construction and the substantially reduced height dimensions of the unique compound sliding seal unit comprising the present invention permits on-demand changes of height (elevation) for the mounted, optionally rotatable, rod-like member (or spindle) which extends from the atmospheric environment area and is passed through the air-tight seals of the compound unit into the limited spatial volume of a confined vacuum environment then present within a conventional ion implantation apparatus. The compound sliding seal unit also allows the user the capability to maintain a substantially constant vacuum within the confines of the vacuum environment without regard to the fact that the height of the feed-through member can be raised and lowered repeatedly at will.

Among the major benefits and advantages of this uniquely constructed, reduced height, compound sliding seal unit are:

(a) The availability of new volumetric space as an extension of the vacuum environment, which is adequate for the placement and use within the vacuum of a deep Faraday cup to capture the ion beam whenever it is not being intercepted by a target for implantation;

(b) The opportunity to utilize an ion beam line height which is lower within the existing dimensions of the vacuum environment;

(c) The capability to elevate the position of the optionally rotatable feed-through member to a maximal height, or to a minimal height, or to any desired intermediate height position between the maximal and minimal limits, whenever needed or desired; and (d) The attraction of being able to perform a pre-programmed sequence of height changes routinely and repeatedly—while concurrently maximizing the quality of vacuum, the accuracy of dosimetry, and the control of sputtered contaminants.

I. Embodiments

It is a particular feature and singular characteristic of the present invention that the unique construction of the device requires the presence of not less than two discrete slideable plates (oriented upright in the preferred embodiments) which are movably joined to a single fixed and immovable plate to form one unified construct. The two slideable plates lie next to and in parallel with each other; are coordinated in their individual movements and drive actions; and act in concert together with a plurality of gas-tight sliding seals while positioned against the single fixed and immovable plate—such that no direct opening or gaseous leakage is ever created among them while located at the atmospheric environment side of an adjacently positioned vacuum environment. Nevertheless, the height dimension and overall size of the compound sliding seal unit is markedly smaller than conventionally known articles, and takes up far less volumetric space while achieving its highly desirable functions and results.

A. Structural Arrangement and Organization of the Discrete Plates

Figures 5A, 5B:
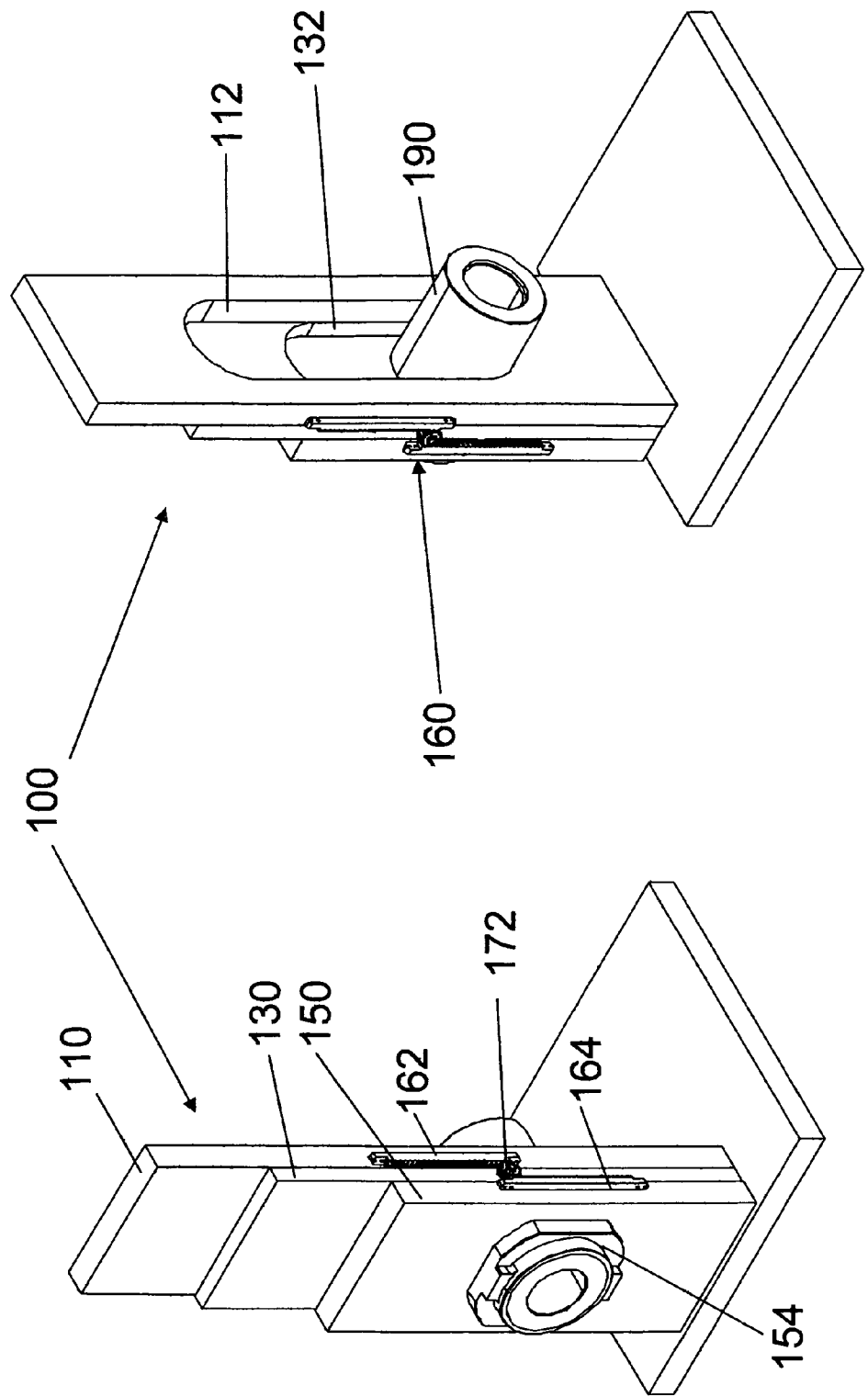
FIGS. 5A and 5B are perspective views of one embodiment for the compound sliding seal unit in its minimal height position as seen from outside and from inside the vacuum chamber.

FIGS. 5A and 5B illustrate the structural arrangement of and organization for the unique atmosphere environment to vacuum environment compound sliding seal unit. FIGS. 5A and 5B show the requisite elements and essential components of one preferred embodiment for the construct. FIG. 5A illustrates the invention as it appears at its lowest height or "home" position when seen from the atmospheric environment side, while FIG. 5B provides a view of the unit as it appears at its lowest height or "home" position when seen from inside the vacuum environment. Accordingly, these views will serve as a clear recognition and constant reminder that the compound sliding seal unit is intended to be joined to, to be integrated with, and to become part of the tangible vacuum chamber wall—which separates the atmospheric environment area from the vacuum environment region of the ion implantation apparatus.

The Placement and Arrangement of the Discrete Plates

Accordingly, as seen in FIGS. 5A and 5B, the compound sliding seal unit 100 appears as a unitary construction that comprises at least three separate and individual plates: an erect fixed and immovable inner scan plate 110; an erect and movable on-demand, sliding intermediate scan plate 130; and an erect and movable on-demand, sliding outer scan plate 150.

Figure 10:
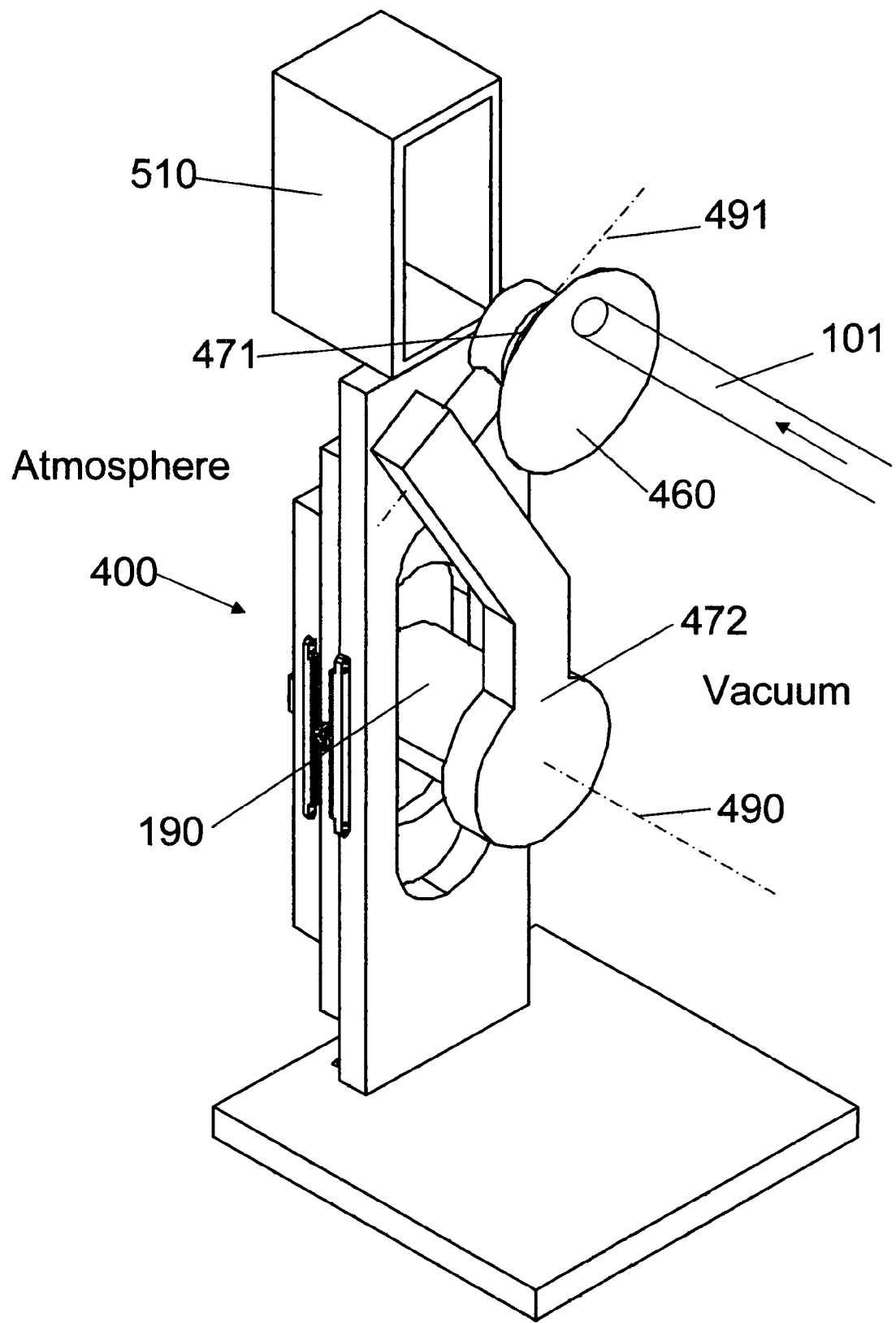
FIG. 10 is a perspective view of the compound sliding seal unit with an attached pivotal radial arm translation device in relation to the trajectory of a traveling ion beam as it appears within the vacuum environment of an ion implantation apparatus.

In this document, the term 'forward' when applied to a compound sliding seal unit or components thereof refers to the direction from the fixed plate 110 toward the sliding outer plate 150, and 'rearward' refers to the opposite direction. The apparatus to which the invention is applied comprises a chamber whose interior is pumped to high vacuum. 'Inner' refers to proximity to the interior of the vacuum chamber, and 'outer' to proximity to atmosphere. FIG. 10 shows ion beam 101 implanting workpiece 460. Ion beam 101 is traveling in the forward direction, as used herein. 'First', 'second' and 'third' are used to indicate position in a sequence counting in the 'forward' direction, as defined above, unless otherwise indicated.

Each of the three upright scan plates 110, 130, 150 is a preformed, inflexible planar sheet or panel formed of stiff material; each is substantially flat, relatively thin, and parallel-sided; each has flat, smooth, and hard surfaces upon which the sliding seals bear; and each has a substantially similar width dimension and thickness dimension. There are, however, very marked differences and clear distinctions among the three plates concerning their individual length dimensions and the presence or absence of an open channel.

As shown by FIGS. 5A and 5B, the erect fixed inner scan plate 110 is by far the longest; the erect and movable on-demand sliding intermediate scan plate 130 is substantially less in overall axial length (typically by half the available travel) in comparison to the length dimension of the fixed inner scan plate 110; and the erect, movable on-demand, sliding outer scan plate 150 is much smaller in overall axial length (often by the amount of available travel) in comparison to both the intermediate scan plate 130 and the fixed inner scan plate 110, and thus is by far the shortest of all three discrete plates.

It will be noted also via FIGS. 5A and 5B that the centrally disposed open slot 112 present within the fixed and immovable inner scan plate 110 is far longer in its span (its measurable void distance from end to end) than the span distance of the cavity zone 132 centrally disposed within the slideable intermediate scan plate 130; and that the void volume of the centrally disposed open slot 112 is aligned with, overlaps, but extends beyond the void volume of the immediately adjacent cavity zone 132. Thus, in the particular embodiment illustrated by FIGS. 5A and 5B, the length of the void volume for the centrally disposed cavity zone 132 within the intermediate scan plate 130 which is not occupied by the shaft of the feed-through member 190 is about 50% of the length dimension for the open slot 112 centrally disposed within the fixed and immovable inner scan plate 110, less the shaft diameter.

Also via FIGS. 5A and 5B, it will be appreciated that the slideable outer scan plate 150 has no open slot or cavity zone as such. Instead, the outer scan plate 150 presents a fully secured and gas-tight, central mounting 154 which is structurally adequate for attaching and supporting an optionally rotatable feed-through member or spindle 190—which, after being mounted, has a preset axial length sufficient to extend across and pass through the spatial voids of both the elongated open slot 112 and the cavity zone 132 concurrently. Details of the optionally rotatable vacuum-sealing bearing/feedthrough spindle 190 are well-known to those experienced in high vacuum systems, and are not described in further detail here.

Embodiments Having Multiple Intermediate Plates

Some preferred embodiments of the compound sliding seal unit will be constructs having multiple sliding intermediate plates positioned in parallel and in series. In these constructions, each discrete slideable intermediate plate in the series has forward-facing and rearward-facing surfaces, prechosen width and thickness dimensions, a length dimension shorter than the limited length dimension of said fixed inner plate, and a centrally disposed cavity zone whose span distance is not greater than fifty percent of the span of said open slot in said fixed inner plate.

In addition, the plurality of discrete sliding intermediate plates are cumulatively aligned in parallel and lie in series one directly behind the other; are collectively located between the fixed and immovable inner scan plate and the slideable outer scan plate; and are individually positioned adjacent to and slideable on-demand over the fixed inner plate.

To demonstrate further the relationships and major differences existing among the discrete plates concerning their individual length dimensions and the presence or absence of an open channel, the data of Table 1 is given below. It will be recognized and appreciated, however that the information given by Table 1 is merely representative and illustrative of the various embodiments that are deemed to be of greatest commercial value; and thus the particular data are neither limiting nor restrictive of the present invention in any manner nor for any purpose.

TABLE 1

| | |
|---|---:|
| Beam Size | 100 mm |
| Wafer size | 300 mm |
| Required travel | 400 mm |
| Safety margin and turning allowance | 52 mm |
| Desired travel | 452 |
| Shaft diameter | 180 mm |
| Slot length in fixed plate | 632 mm |
| Seal space | 33 mm |
| No intermediate plate (Prior Art): | 0 |
| Overtravel each end | 485 mm |
| Slot length | 632 mm |
| Total | 1602 mm |
| One intermediate plate | 1 |
| Overtravel each end | 259 mm |
| Slot length | 632 mm |
| Total | 1150 mm |
| Two intermediate plates | 2 |
| Overtravel each end | 183.6667 mm |
| Slot length | 632 mm |
| Total | 999.3333 mm |

The Relationships Among the Differently Sized Void Volumes

For purposes of fully appreciating the present invention, it is critical to understand the proper relationship between the span of the open slot in the fixed inner plate in comparison to the span distance(s) of the cavity zone(s) in the intermediate plate(s). This is most easy achieved by referring to the construct shown by FIGS. 5A and 5B respectively.

The fixed and immovable inner plate 110 contains an open slot 112 whose void volume and span distance is equal to the additive sum of the diameter size of the feed-through member 190 to be passed though the open slot 112 and the maximum available travel distance of the open slot 112 through which the feed-through member 190 may be moved.

In comparison, each slideable intermediate plate 130 present as part of the compound unit contains an individual cavity zone 132 whose overall axial void length is equal to the additive sum of the diameter size of the feed-through member 190 and an appropriate fraction of the total travel distance through which the feed-through shaft may be moved. This latter calculated sum will vary with the number of intermediate scan plates 130 actually present in that embodiment—i.e., one half (50%) the total distance in the case of a single intermediate plate; two thirds (66.7%) in the instance of the first of two discrete intermediate plates, and one third (33.3%) for the second of two discrete intermediate plates; similarly respectively three, two, and one fourths in the case of three discrete intermediate plates; and so on progressively for as many movable intermediate scan plates as exist for that embodiment.

An Algebraic Explanation for the Plate Length Relationships

Let the vertical scan distance traveled be t. Let the shaft diameter be "d". Let the space required for the set of sliding seals and differential pumping (in the direction of travel) be "s". Therefore:

(i) The length dimension of the fixed inner plate can be no shorter than $(t+d)+2(s+t/2)=2t+2s+d;$ (ii) The length dimension of the slideable intermediate plate can be no shorter than $t/2+d+2(s+t/2)=2s+3t/2+d;$ and (iii) The length dimension of the slideable outer plate can be no shorter than $d+2s+2(t/2)=2s+t+d.$ In contrast, for the conventionally known prior art systems limited to using a total of only two discrete plates (one fixed plate and one movable plate), the fixed plate can be no shorter than the sum of $3t+2s+d;$ and the moving plate can be no shorter than the sum of $2t+2s+d.$ Thus the amount of vertical space saved by the present invention is "t", the total travel distance, which is itself no less than the additive sum of the substrate height and the beam height together. Similarly, if two discrete intermediate plates are used, the amount of space saved increases to 1.33 t; and if three discrete intermediate plates are used, the space saved increases to 1.5 t.

B. The Sliding Seals

Within the compound sliding seal unit of the present invention, at least two sliding seal articles are typically employed as hermetically sealing closures: A first seal article which effects an air-tight closure, offers a gliding or sliding contact surface, and provides the means for differential vacuum pumping; and at least one similar additional seal article. These seal articles are illustrated by FIGS. 5A, 5B, 6A, and 6B respectively herein. Each sliding seal has similar shape and construction. Note however that while each sliding seal has an oval form, the span of the first sliding seal will typically exceed that of the second sliding seal and any additional seals.

By definition, a sliding seal of either type is a preformed and flexible configured article formed of a pressure resistant and demonstrably resilient gas sealing material. Moreover, by purpose and function, each embodiment of a sliding seal will prevent air from passing through it; will eliminate gaseous leakage while positioned at the atmospheric environment side of an adjacently existing vacuum environment; and has smooth surfaces which allow a plate or panel to glide or slide freely over its material surface with a minimal degree of friction and/or resistance.

One generally useful embodiment of the sealing seal appears as a simple viton o-ring. Another possible embodiment is a set of o-rings backing polyethylene flat seals as described by Ryding [see U.S. Pat. No. 4,229,665].

In the preferred embodiments, however, the sliding seal often is a substantially flat and relatively thin, oval ring of solid matter with a slideable contact surface having a low coefficient of friction (as exemplified by polyethylene). Also in these preferred formats, in order to provide high compliance and uniform pressure for the seal as a discrete article of manufacture, it is preferably backed and supported in place by one or more elastomer o-rings whose functions are to seal and to provide pressure and compliance, but not to offer any sliding contact surface. Rather, all sliding contact is to be made and occurs only between the flat material of the sliding seal article and an exposed surface of a discrete slideable plate. FIG. 6B presents a diagrammatic cross-section through the construct showing the intended location and placement of these sliding seals.

The First and Second Sliding Seals

Figure 6A:
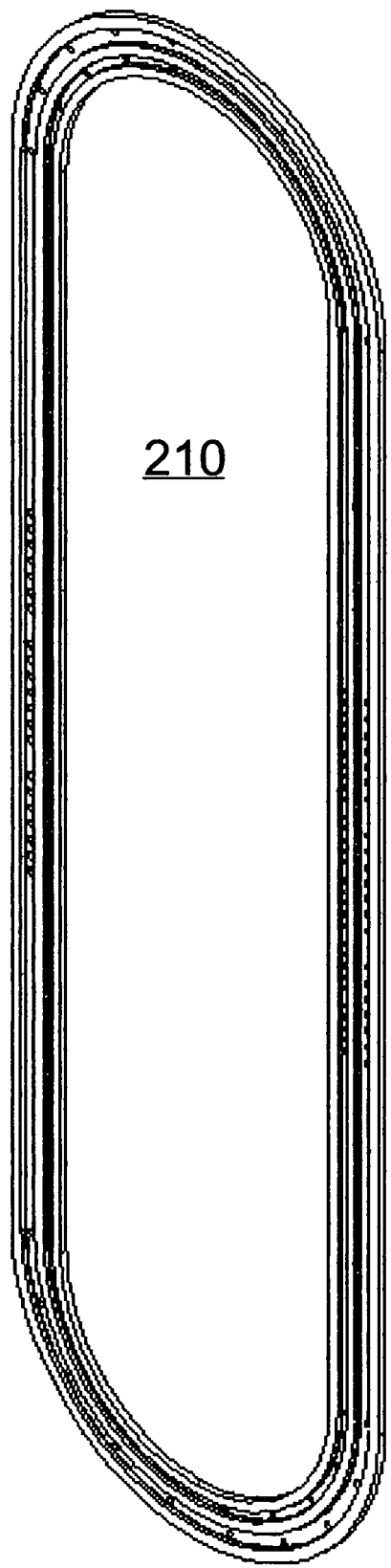
FIG. 6a is a perspective view of a preferred one piece sliding seal.
Figure 6B:
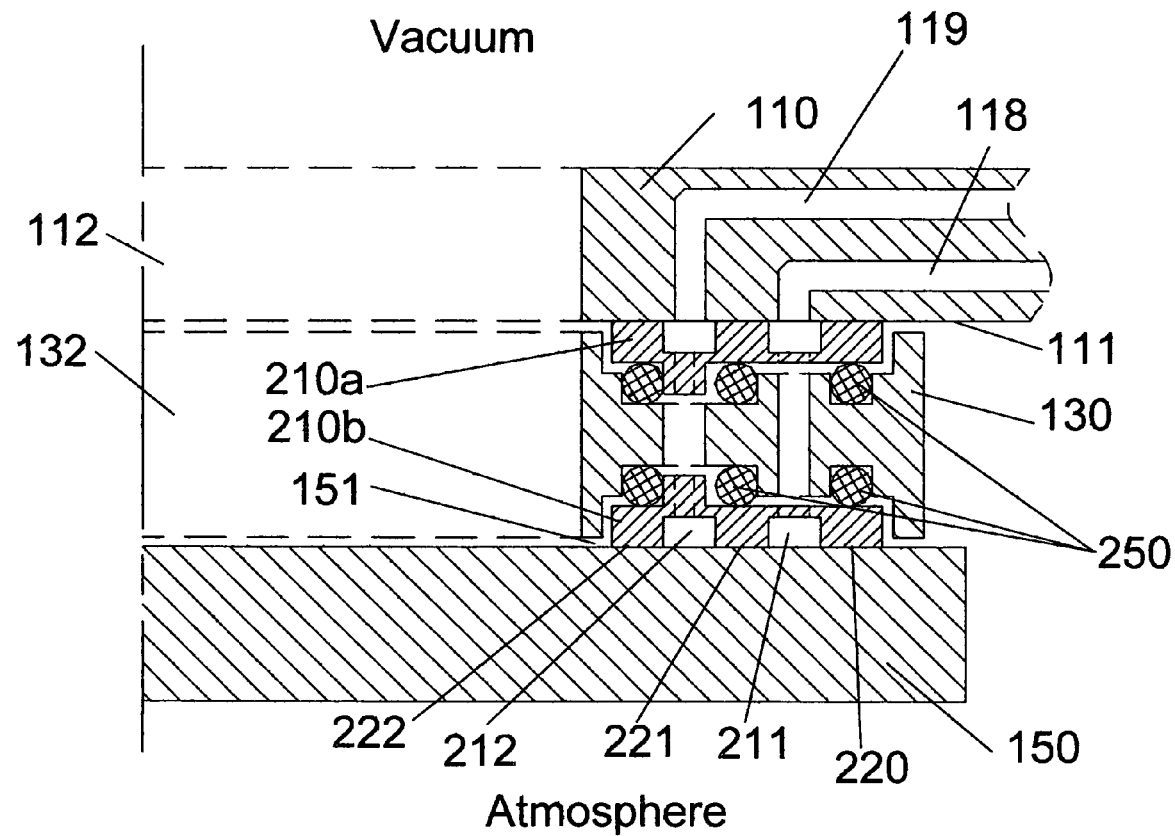
FIG. 6b shows a cross section through one side of a preferred embodiment of the compound sliding seal unit, showing where two of the one-piece sliding seals are used, and showing the cross section of the seal.
Figure 6C:
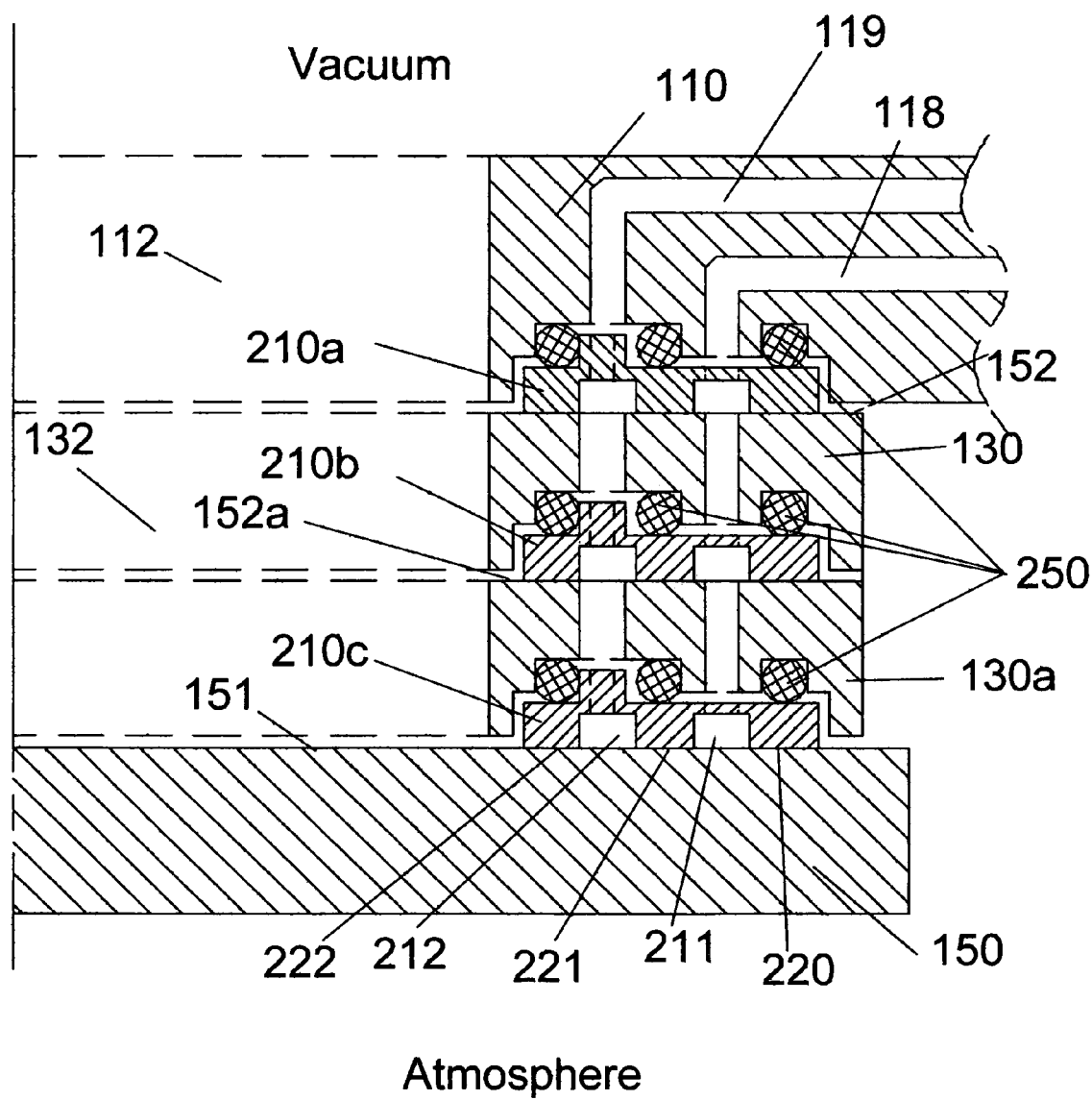
FIG. 6c shows a cross section through one side of an alternative embodiment of the compound sliding seal, showing three seals and two intermediate plates.

As illustrated by FIGS. 6A and 6C herein, within the assembled compound sliding seal unit 100, a first sliding seal 210a is located between the fixed and immovable inner scan plate 110 and the sliding intermediate scan plate 130. The purpose and function of the first sliding seal 210a is to prevent air from passing through it; to eliminate gaseous leakage; and to present a flat, smooth contact surface against which the intermediate scan plate 130 can glide or slide freely with a minimal degree of friction or resistance. The first sliding seal 210a typically is a preformed article of manufacture; and will often appear in an oval ring format, whose preferred construction is described in detail hereinafter.

In one preferred embodiment illustrated by FIG. 6B, the first sliding seal 210a appears as an oval-shaped ring which is located on the rearward-facing surface of the intermediate plate 130, and which contacts and slides upon the forward-facing surface of the fixed inner scan plate 110; and which is located to surround and hermetically enclose the circumferential outline and perimeter edge of the centrally disposed open slot 112.

In this and other preferred embodiments (as illustrated by FIG. 6C), at least a second sliding seal 210b is individually located upon the forward-facing surface of the intermediate scan plate 130 and contacts the rearward facing surface of the next plate, which may be an additional intermediate plate 130a, or may be the fixed inner plate 150; and, when properly placed, typically surrounds, encompasses, and hermetically encloses the circumferential outline and edge perimeter boundary of the centrally disposed cavity zone 132. Said second sliding seal 210b acts to prevent atmospheric air from entering into the adjacent vacuum environment.

In some embodiments, there are additional sliding intermediate plates 130a; and for every additional intermediate plate, an additional sliding seal 210c is required. In these embodiments, as illustrated by FIG. 6c, it is desirable that one discrete seal 210c be individually disposed on the forward-facing surface of each subsequent intermediate plate in the series then present within the construct.

Multiple Sealing Rings Bearing Against a Slideable Plate:

An optional, but often highly desirable, feature of each sliding seal is that the total sliding contact and sealing surface provided by the seal closure may be divided into multiple nested annular zones. This optional feature and arrangement is illustrated by FIGS. 6B and 6C, which shows three nested annular zones 220,221,222—each of which is separated by a groove 211 or a recess 212. The sealant material bridging each groove 211 is relatively thin and therefore flexible; and is perforated to allow gas to travel through this region into passages within the intermediate plate. The function of the grooves 211 and recesses 212 is to allow and to provide for the application of differential vacuum pumping (via the fixed and immovable inner scan plate 110) to the grooves and spaces between the three separate sealing zones.

When constructed for the purpose, the annular zones constituting each sliding seal 210a, 210b also offer and provide: two individual internal conduit systems, each of which is in gaseous communication with a separate pumping channel; and two discrete portal connections for attachment of flexible web hoses, or alternately passages 118, 119 built into the fixed plate and communicating with the grooves and spaces of the first sliding seal.

Thus the outer or primary zone 220 of the sliding seal surface provides a seal or closure which separates atmospheric pressure from the first groove 211. This groove is connected via passage 118 and/or hoses and other perforations, to first differential pumping means (not shown), which serve to evacuate a large fraction of any gas which succeeds in passing this outer seal. The pressure in this groove 211 typically is about 5000 Pa.

Similarly, the intermediate zone 221 of a sliding seal surface provides a secondary seal or closure which separates atmospheric pressure from the from the second, inner groove 212, which is connected via passage 119 and/or hoses and other perforations to second differential pumping means (not shown) and which act to evacuate a large fraction of any gas which succeeds in passing this intermediate seal. The pressure in groove 212 typically is about 300 Pa.

Finally the inner zone 222 of the sliding seal surface provides a tertiary seal or closure which separates groove 212 and the high vacuum in the vacuum chamber. It is well known that the volumetric leak rate through a restricted space is much lower at vacuum levels where the mean-free-path between gas molecules exceeds the dimensions of the passage (in this case any microscopic gap between the sealing surfaces), and therefore the improvement in ultimate vacuum provided by this differential pumping system is very great, because the final seal is operating under high mean-free-path vacuum conditions.

Thus, the preferred and properly positioned first sliding seal will serve not less than three distinct goals and purposes:

(1) It acts as an gas-tight sealant to prevent atmospheric air or a gaseous leakage existing between the fixed and immovable inner scan plate 110 and the slideable intermediate scan plate 130 from entering the vacuum environment;

(2) It provides a flat sliding contact surface such that each intermediate plate 130 then present within the construct can be moved at will smoothly and in an air-tight fashion over the forward facing surface of the fixed and immovable inner scan plate 110; and (3) It provides two discrete conveyance systems which are individually in gaseous communication with the Rough Differential Pump Channel and the Differential Pump Channel of the fixed and immovable inner scan plate for on-demand differential vacuum pumping.

The Additional Sliding Seals

In general, one additional sliding seal 210c is located on the forward-facing surface of each movable intermediate plate 130a then present within the construct, where it is carefully placed to surround and hermetically enclose the mounted feed-through member 190.

In these preferred instances therefore, each movable intermediate plate then present in the construct will have one discrete additional sliding seal disposed upon it. Via this format and positioning, the individual cavity zone of each intermediate plate will be hermetically closed by a sliding seal. It is a matter of convenience whether each sliding seal is mounted to face forward or backward, and FIGS. 6b and 6c show alternative arrangements.

Furthermore, it will be recognized and appreciated that the additional sliding seals share attributes and features in common with the first sliding seal: All of sliding seals have similar or identical cross sections, but may have different lengths. Both are attached to and disposed upon the discrete plate, often fitting into recesses provided for the purpose, so that they move with it. The sliding seals preferably will make contact with supporting o-rings, which provide a stationary but compliant support and which urge the sliding seal against the flat plate surfaces upon which they respectively reside. Typically, precisely aligned rails and cars (not shown) are required to maintain the required pressure while permitting sliding.

Alternative Sliding Seal Arrangements

Figures 12A, 12B:
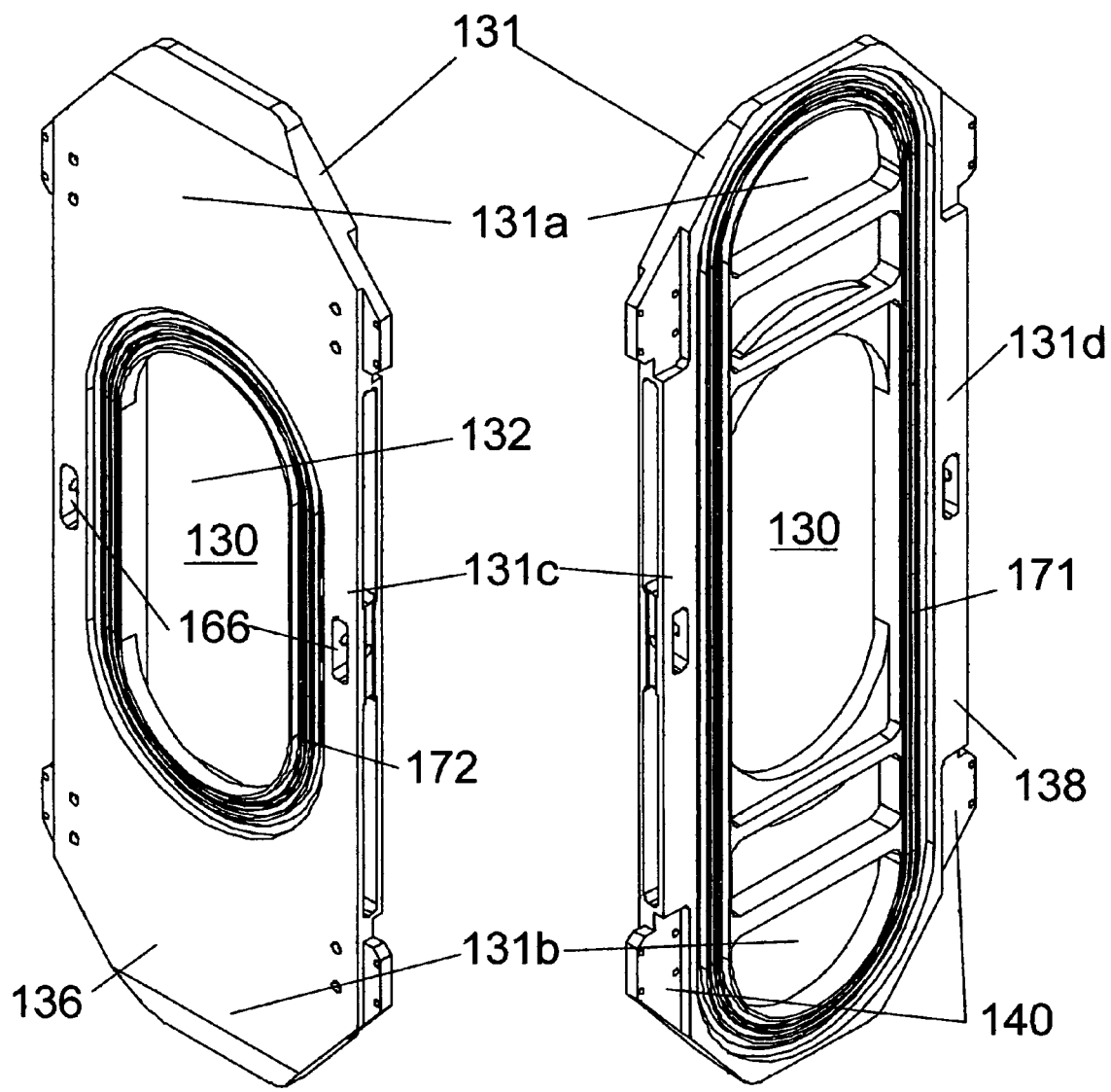
FIG. 12a is a perspective view of the forward facing surface for the slideable intermediate scan plate in the compound sliding seal unit.
FIG. 12b is a perspective view of the rearward facing surface for the slideable intermediate scan plate in the compound sliding seal unit.

An optional, but often desirable, elaboration and supplemental enhancement of the present invention which employs two more discrete sliding seals within the construct is illustrated by FIG. 6B. As shown therein, a discrete sliding seal 210b is individually located in a contoured recess in the forward-facing surface of the intermediate scan plate 130, as shown in FIG. 12a; and a discrete sliding seal 210a is individually located in a contoured recess in the forward-facing surface of the intermediate scan plate 130, as shown in FIG. 12b. These two sliding seals rest directly opposite and adjacent to each other; however one is longer than the other, by the amount of available travel, as is shown by the juxtaposition of the two views (FIG. 12a and FIG. 12b) of intermediate plate 130. In this format, the optionally present sliding seals 210a and 210b each surround, encompass, and hermetically encloses the circumferential outline and edge perimeter boundary of the centrally disposed cavity zone 132; and acts to prevent atmospheric air from entering into the adjacent vacuum environment, but sliding seal 210a is long enough that at all allowed positions of intermediate plate 130 is also similarly encloses the slot in fixed plate 110.

Each sliding seal is preferable located on one plate by installing it in a recess in one surface of said plate, and this seal will then slide upon a face of an adjacent plate. It is a matter of choice and convenience whether the seal is located in a forward- or rearward-facing surface; also other methods of so locating the seal may be devised. However, if located on a rearward-facing surface, the seal will have to be longer than is located on a forward-facing surface, since the sizes of the voids through which the feedthrough passes differ, and the seal must at all times surround the void around which it is intended to provide a closure.

C. Means for Sliding Each of the Movable Plates On-Demand

Each and every embodiment of the unique compound sliding seal unit will include discrete means for sliding each of the discrete movable scan plates on demand. In one embodiment, a linear electric motor is used; its track is attached to the fixed plate; and its actuator is attached to the moving plate. To reduce the static load on the motor, the weight of all the moving parts acting on the motor is counterbalanced by a spring mechanism, well known to those familiar with such equipment, and similar in function to that described by Ryding in U.S. Pat. No. 4,229,655. It would also be acceptable to use the lead screw drive mechanism and counterbalance system described in that patent.

In the preferred embodiments shown by FIGS. 5-8 herein, the compound sliding seal unit 100 provides and includes a double rack and pinion mechanism 160 by which to move the intermediate scan plate 130. This preferred double rack and pinion mechanism 160 typically includes: a fixed rack 162, which is fitted to the immovable inner scan plate 110 and whose teeth face towards the movable sliding intermediate scan plate 130; and a moving rack 164, which is fixed to the slideable outer scan plate 150 and whose teeth also face towards the movable sliding intermediate scan plate 130.

Coordinating this pair of racks 162, 164 is an optional pinion system 170 which comprises one or more toothed spur wheels 172. The spur wheels 172 join and tangibly link the fixed rack 162 to the moving rack 164; and they force the intermediate plate to move at precisely half the velocity of the outer movable plate.

In the absence of such a mechanism, the motion of the intermediate plate would depend on the friction between the plates—specifically the intermediate plate would stick to either the moving plate or the fixed plate until the shaft struck an end of the slot in the intermediate plate, when it would be forced to change its velocity suddenly. Such jerks and non-deterministic behavior are undesirable, and the spur wheels and racks avoid the problem.

Provision can also be optionally made for on-demand individual movement and separate at-will height displacement (vertical elevation) of the two discrete erect sliding scan plates 130, 150.

D. Juncture of the Compound Unit into the Vacuum Chamber Wall

Figures 11A, 11B:
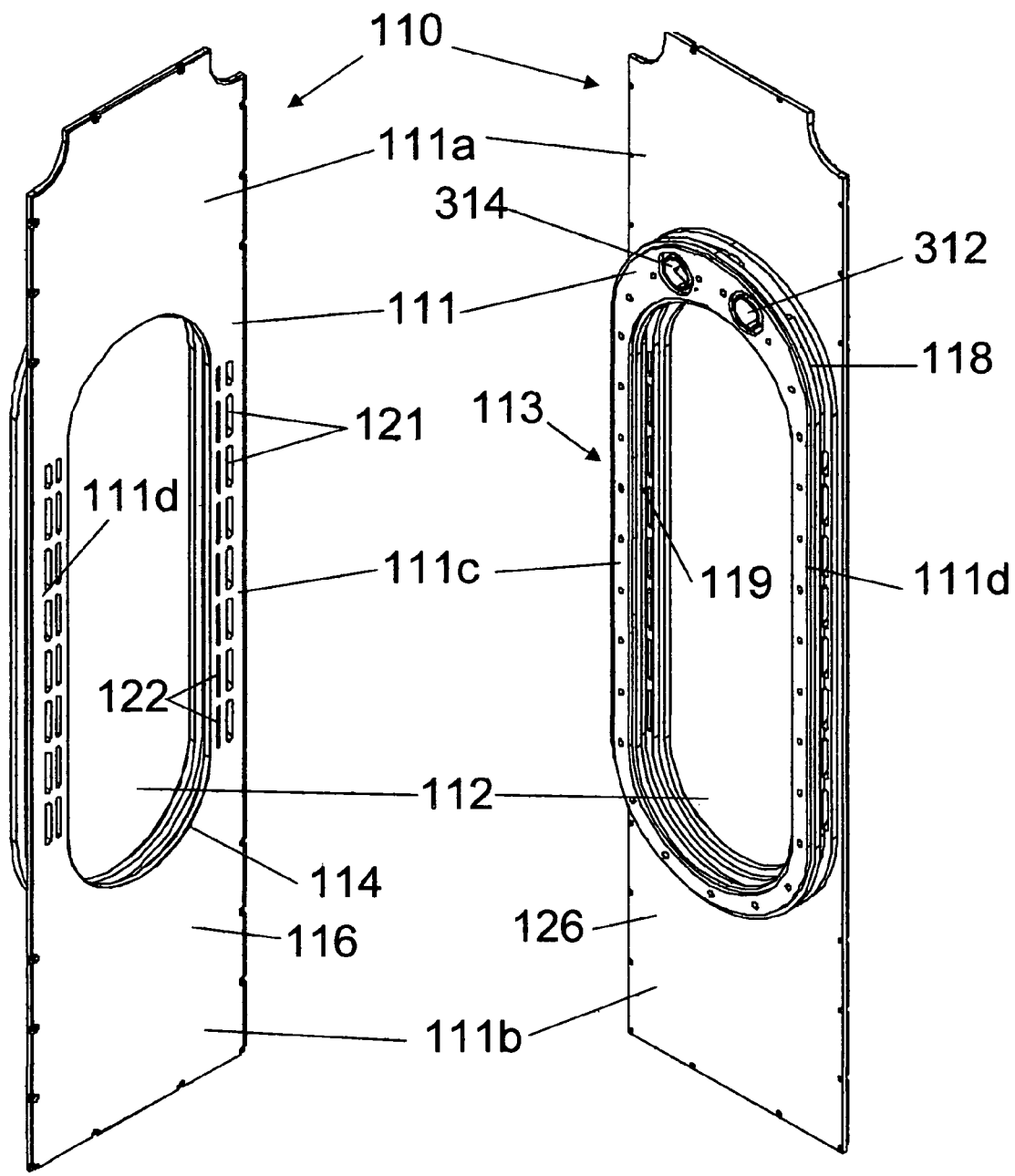
FIG. 11a is a perspective view of the forward facing surface (away from the high vacuum chamber) for the fixed and immovable inner scan plate in the compound sliding seal unit.
FIG. 11b is a perspective view of the rearward facing surface and optional structure for the fixed and immovable inner scan plate in the compound sliding seal unit.

It will be noted and appreciated that the fixed and immovable inner scan plate 110 of the compound unit 100 illustrated by FIGS. 5A and 5B is intended to be permanently joined to and to form an integrated part of the wall of the vacuum chamber then to be found within a conventional ion implantation apparatus. To achieve this purpose and intention, several choices are available. For example, the fixed and immovable inner scan plate 110 may be formed as an original part of the vacuum chamber wall, for example by welding. Alternatively, the fixed and immovable inner scan plate 110 can be a separately manufactured flat plate which has been bolted and sealed to a portion of the pre-existing vacuum chamber wall using an appropriate vacuum seal, such as an O-ring. A preferred embodiment makes connections to differential pumping means by means of additional passages and o-ring seals between plate 110 and the wall of the vacuum chamber, and is more fully described below. FIG. 11b illustrates plate 110 in an embodiment which incorporates a structure for this purpose. Such a mode of attachment is not essential, and differential pumping connections could be provided by means of flexible hoses.

In contrast, both the outer scan plate 150 and the intermediate scan plate 130 are freely mobile and can be displaced at will from either their original height positions or any previous employed elevated position. The plates are attached to linear bearings which move on rails attached to the fixed plate, and thereby to the vacuum chamber, allowing the plates a precise and controlled range of motion. These rails are not illustrated but are similar to those shown by Ryding [see U.S. Pat. No. 4,229,655]. The vertical motion of the moving plate is driven by an electric motor and lead-screw mechanism. The motion must be precise, as it controls the dose-rate of the workpiece with implanted ions, as is well-known.

The double rack and pinion system is a passive system, separate from the drive system, which ensures that the intermediate plate moves at half the velocity from the driven outer plate.

II. How the Compound Sliding Seal Unit Functions In-Situ

FIGS. 5A and 5B respectively show the position of the individual scan plates at their lowest height or characteristically the "home position". Note that FIG. 5B shows the arrangement of discrete plates as seen from inside the vacuum environment.

Any device of interest to be operated within the vacuum environment (such as a pivotal scanning arm translation assembly) will be placed and supported upon the axial end of the feed-through member or spindle 190 then projecting into the vacuum chamber through the centrally disposed cavity zone 132 within the movable intermediate scan plate 130 and the centrally disposed open slot 112 within the fixed inner scan plate 110. Note also that via this arrangement of discrete plates, there is no direct pathway or route by which atmospheric air can pass through the compound unit and thereby enter the vacuum environment.

In contrast, FIGS. 7A and 7B show the height adjustable mechanism of the compound sliding seal unit when set at a middle elevated position. The vertical movement and displaced distance between the movable intermediate scan plate 130 and the outer scan plate 150 has been coordinated and set in place via the double rack and pinion mechanism 160. The pinion wheels each rotate around a shaft fixed to the intermediate scan plate 130; and such rotation causes the intermediate scan plate 130 to side and move vertically relative to the fixed rack 162 lying against the fixed and immovable inner scan plate 110. In a similar manner, the pinion wheel rotation against the drive rack 164 mounted against the movable outer scan plate 150 causes the outer scan plate to move and become elevated vertically.

Note that this double rack and pinion mechanism arrangement produces a 2:1 ratio elevated displacement and vertical movement—i.e., the outer scan plate 150 will move twice as far (in vertical displacement distance) as the intermediate scan plate 130. Furthermore, FIG. 7B shows that, as viewed from the vacuum environment side, no direct air pathway or gaseous point of entry has been opened up by the compound sliding seal unit between the vacuum environment and the external atmosphere environment despite having raised the feed-through member 190 to a middle elevation position.

Attention is also directed to FIGS. 8A and 8B respectively, each of which shows the compound sliding seal unit after being elevated to its maximum height position via the double rack and pinion mechanism. Note again that FIG. 8B shows the arrangement of plates as seen from inside the vacuum environment.

Accordingly as seen therein, the vertical movement between the movable intermediate scan plate 130 and the outer scan plate 150 has been coordinated and set in a fixed velocity ratio via the pinion and double rack mechanism 160. The pinion rotates around a shaft fixed to the intermediate scan plate 130; and its rotation is caused by the movement of the driven rack 164 attached to the moving plate 150, while it is also engaged with the fixed rack 162. As a result the intermediate scan plate 130 is constrained to move at half the velocity of the moving plate 150.

FIG. 8B also shows that, as viewed from the vacuum environment side, no direct air pathway or gaseous point of entry has been opened up by the compound sliding seal unit between the vacuum environmental and the external atmosphere despite having raised the feed-through member 190 to the greatest possible elevation allowed.

The Reduced Height of the Fully Elevated State

Figure 2:
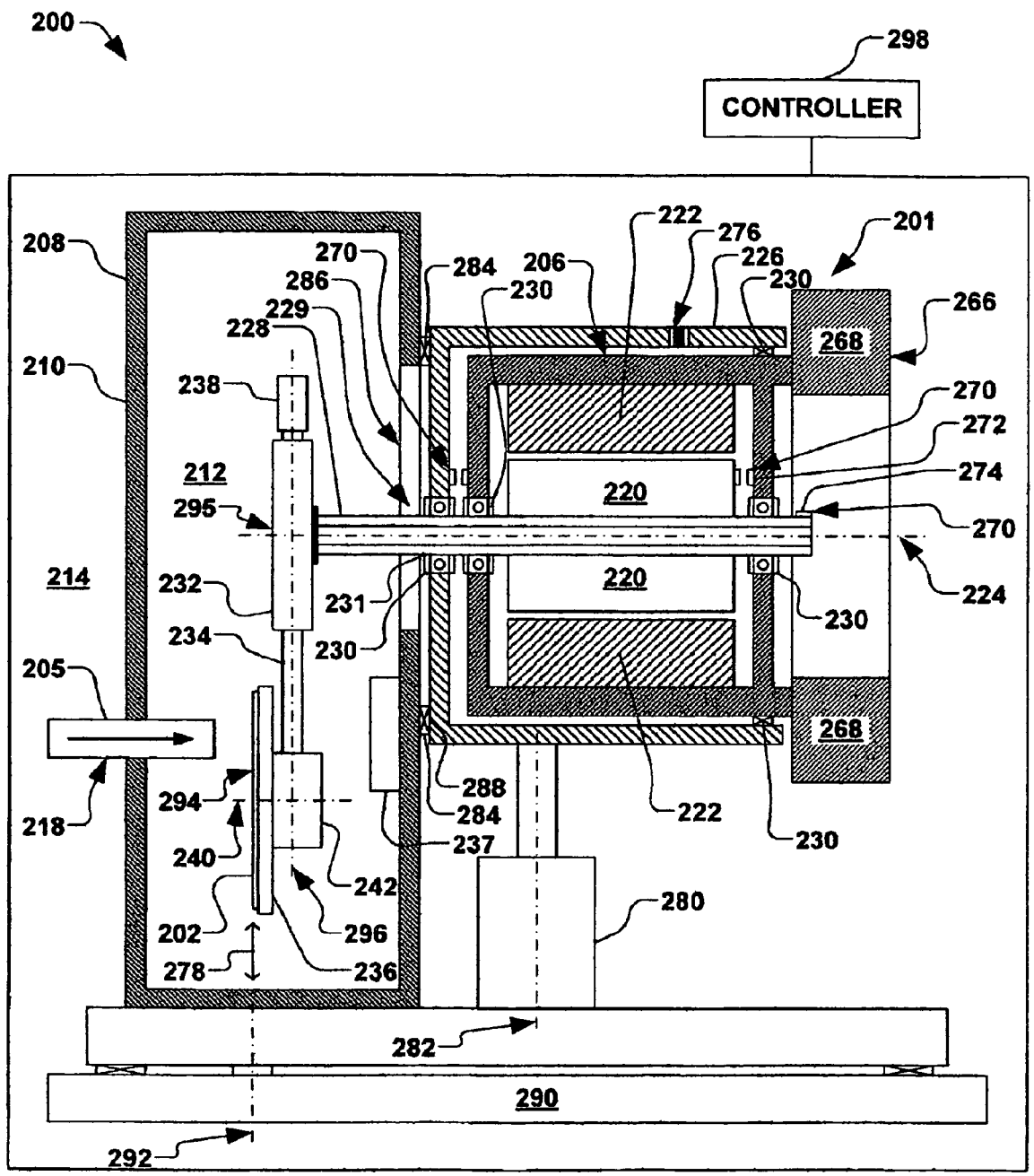
FIG. 2 is a conventionally known and used pivotal arm mechanical scanning system in which the drive mechanism and sliding seal prevent a deep Faraday cup form being used within the vacuum chamber.
Figures 3A, 3B:
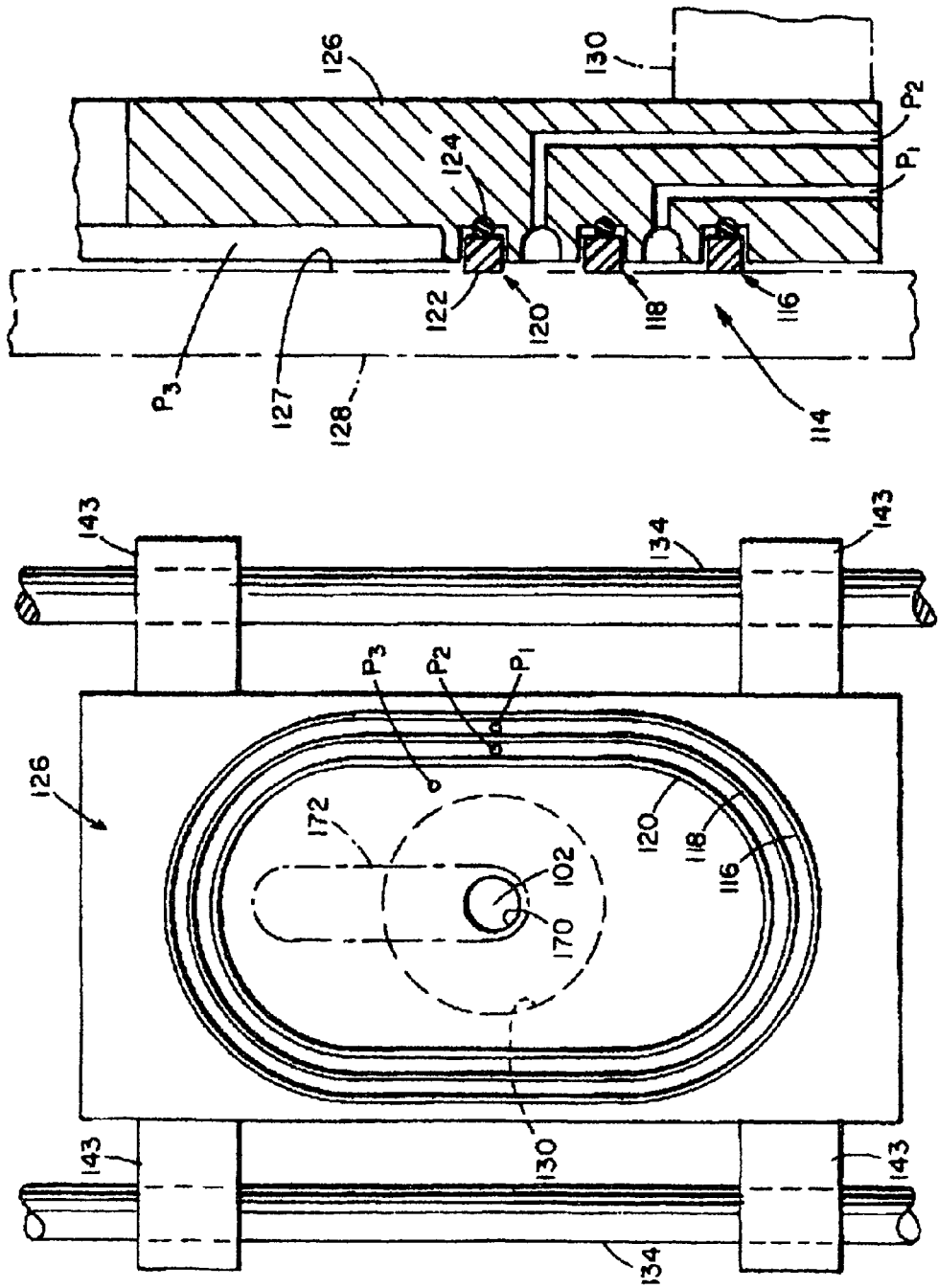
Figure 9:
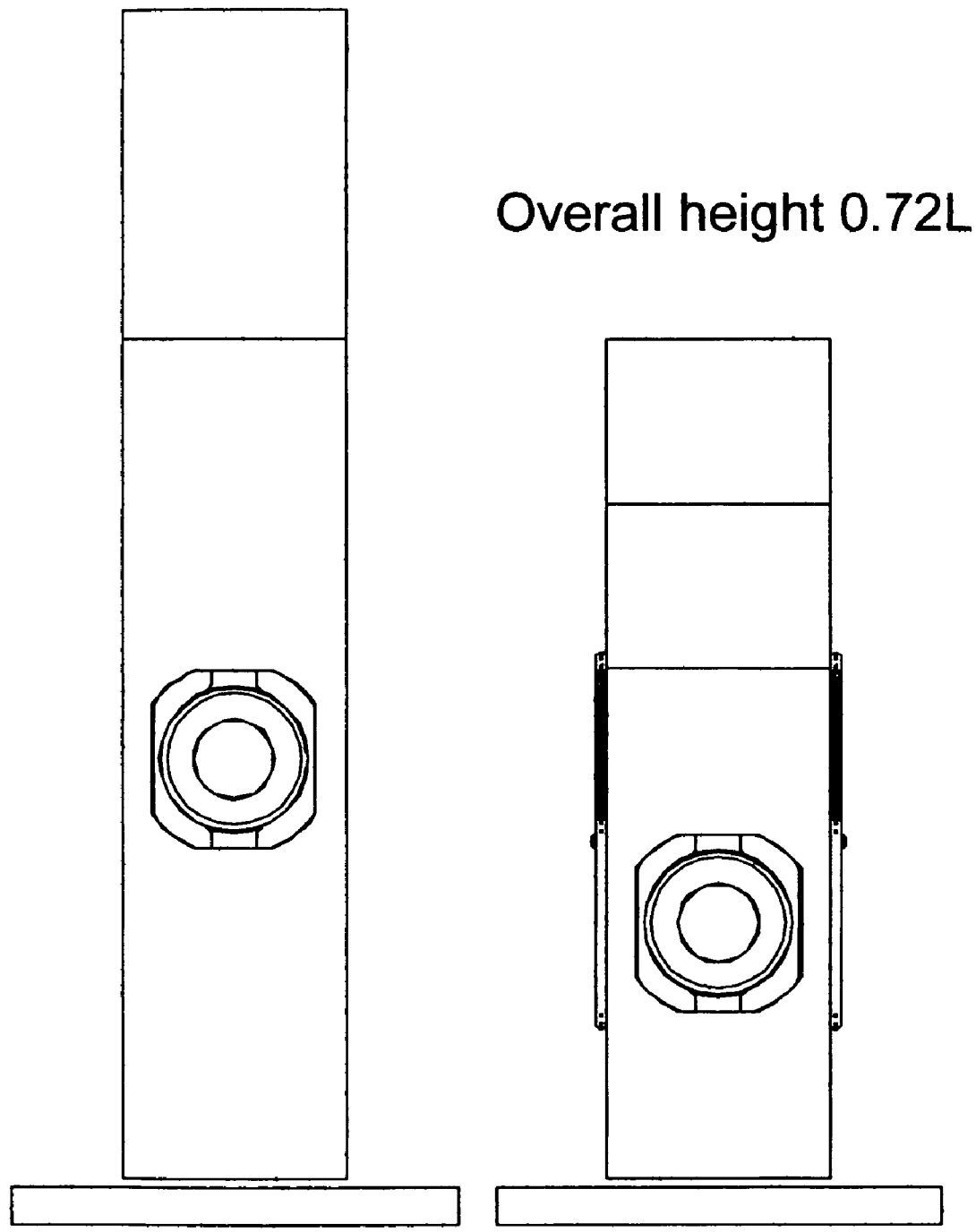
FIG. 9 is a visual comparison of the differences in maximal height dimension existing between a conventionally known sliding seal device and the compound sliding seal unit of the present invention.

FIG. 9 shows the space saving advantage provided by the multiple sliding plate system of the present invention. As seen therein, the conventionally known device having a single fixed plate and one movable plate previously illustrated by Prior Art FIG. 2 is compared in its maximal height dimension with the embodiment of the present invention illustrated by FIGS. 4-8 respectively. Clearly, the compound sliding seal unit, when elevated to its maximum vertical elevation, is far shorter in overall height than its prior art predecessor. This is illustrated by Table 1 (above), which compares the present invention with the prior art case with no intermediate plate.

It will be noted and appreciated also that both devices illustrated by FIG. 9 will travel 450 mm of vertical elevation distance; will provide for a seal with a 33 mm width dimension; and will include an axially extended feed-through member or spindle whose external diameter size is 180 mm. However, the overall or maximal height dimensional requirement for the fully elevated conventional device, given as "1.0 L—prior art", is 1600 mm. In comparison, the compound sliding seal unit of the present invention presents a substantially reduced maximal height dimensional requirement of only "0.72 L" or 1150 mm—i.e., a substantial difference of 28%. Further, if two discrete intermediate plates are used, the total height required is 0.62 L, or 999 mm.

III. Usage as Part of an Ion Implanter Apparatus

The details of a preferred mechanical, two-dimensional, compound sliding seal integrated into the wall of a vacuum chamber are shown by FIG. 10. As shown therein, the compound sliding seal unit includes a mounted and secured, axially extended, rotatable spindle; and upon the extended end of this spindle rests a conventionally known radial arm pivotal translation mechanism 400 [see U.S. Pat. Nos. 7,057,192 and 7,135,691].

Mode of Application

The expected manner of use and mode of application for the unique compound sliding seal unit is illustrated by FIG. 10. As seen therein, the radial arm pivotal translation mechanism 400 includes an electrostatic chuck 471, suitable for holding and radially moving a workpiece 460. The electrostatic chuck 471 holding the workpiece 460 is mounted on an radial arm 472; and the radial arm 472 can be pivoted about a horizontal axis 490—upon which axis the extended, rotatable spindle 190 is positioned at a preselected distance (900 mm in this instance) from the center of the workpiece 460, and is situated to lie parallel to the trajectory of the traveling ion beam 101.

When the arm 472 is radially swung to place the chuck 471 along the side of the ion beam pathway 101, independent axis of rotation 491 allows the chuck 471 then to pivot into a horizontal position, thereby allowing a robot arm (not shown) to transfer an ion implanted workpieces off the mechanism and to load a new targeted workpiece onto the chuck 471 from loadports located nearby. Once a new targeted workpiece is loaded onto the chuck 471, the chuck is then rotated in the reverse direction about the horizontal axis 490 until the new workpiece surface lies at a predetermined angle to the trajectory of the traveling ion beam 101 (commonly 0.0 degrees).

Presuming a ribbon ion beam is used, the height or elevation of the arm 472 can be adjusted upwardly or downwardly by a linear motor joined to the compound sliding seal unit 100 until the workpiece is centered on the trajectory of the traveling ion beam. Then, once the desired elevation has been achieved, the arm 472 can be radially rotated from side to side repeatedly at a controlled velocity about axis 490—i.e., back and forth as required, thereby passing the targeted workpiece repeatedly across the trajectory of the traveling ribbon ion beam to implant a desired dose of ions into the workpiece.

In the alternative, if one wishes to carry out an ion implantation procedure having a two-dimensional scan, the arm 472 is initially lowered to the minimal elevation position offered by the compound sliding seal unit 100; and then the height of the spindle 190 is increased incrementally and progressively as the arm 472 and the targeted workpiece 460 is radially pivoted to and fro across the trajectory of the traveling ion beam (which is typically focused upon a spot smaller than the surface area of the workpiece) in a curved zig-zag pattern, thereby implanting a uniform dose of ions into the workpiece in two dimensions.

IV. Performing Differential Pumping Using the Present Invention

Conventionally known sliding seal assemblies all tend to leak a little; and because of such vacuum leakage, it is common to provide for differential pumping of the vacuum housing or space.

For this purpose, at least two nested sliding seals are traditionally used; and the space between the two sliding seals is pumped by an extra vacuum pump, optimized to carry a high gas load at modest vacuum. In this way, the nested seal closest to the high vacuum region is only required to seal against a typical pressure of 300 Pa, rather than against normal atmospheric pressure (100,000 Pa). This practice of differential pumping reduces the leakage of air into the vacuum space by a factor of at least 300; and in actual fact, usually by a far greater factor.

The present invention allows for continuing the prevailing practice of differential pumping in order to reduce the leakage of air into the vacuum environment. The mode and manner by which this is structurally achieved and functionally performed is illustrated by FIGS. 11-14 respectively.

The Inner Scan Plate and its Sliding Seal

FIG. 11a offers a perspective view of the forward-facing surface for the fixed and immovable inner scan plate 110, and FIG. 11b offers a perspective view of the rearward-facing side and structures of a preferred embodiment. Plate 110 has: a planar solid body 111, an open slot 112 with a perimeter edge 114, a forward-facing plate surface 116, and a rearward-facing boss or extension structure 113 within which a number of grooves, channels, or passages are provided. The body portion 111 is subdivided into a top segment 111a, a bottom segment 111b, and two side segments 111c and 111d respectively. As seen in FIG. 11a, along the two side segments 111c and 111d of the planar body 111 are a prepared series of elongated perforations 121 and a prepared series of narrow apertures 122. The elongated perforations 121 are aligned in series to follow the span distance of the open slot 112; and these elongated perforations 121 serve as rough differential ports which collectively form the Rough Differential Pump Channel (118 in FIG. 6b). In a similar manner, the narrow apertures 122 lie in series adjacent to and outside of the elongated perforations 120; and these narrow apertures 122 serve as differential pump ports which collectively form the Differential Pump Channel (119 in FIG. 6*b*). Both the Rough Differential Pump Channel and the Differential Pump Channel are annular in overall appearance and both are co-extensive with the void length of the open slot 112.

On the rearward-facing surface 128 of the fixed plate 110 shown by FIG. 11*b* and integrated therewith is illustrated a fixed structure 113, whose function is to provide a means of connecting said slots 121 and 122 to their respective differential pumping means. This is an illustrative example of a method of providing compact connection to the ports, but many other alternative arrangements can be devised. This structure contains groove 118 connected to port 312, and groove 119 connected to port 314, and these are intended to connect to differential pumping passages formed within the fixed wall of the vacuum chamber to which the fixed plate 110 is fixed. Structure 113 and plate 110 may be machined from a single piece of material, or they may be manufactured by joining two parts. The structure 113 can be housed within a mating recess in the fixed vacuum chamber wall to which the sliding seal unit is attached.

The first differential pump connection 312 of structure 113 provides access and internal conduit communication through the substance of the plate 110 to the elongated perforations 120 serving as rough differential ports, and which collectively form the Rough Differential Pump Channel 118.

In a similar fashion, the second differential pump connection 314 of structure 113 provides access and internal conduit communication through the substance of the plate to the narrow apertures 122 serving as differential pump ports and which collectively form the Differential Pump Channel. The means of sealing this plate to the vacuum chamber so as to isolate these passages are not shown, but are standard vacuum practice.

Separate sources of vacuum are then individually connected to the first and second differential pump connections 312, 314. In one preferred embodiment, the pressure within the Rough Differential Pump Channel is markedly higher than for the Differential Pump Channel; and while the pressure within the Rough Differential Pump Channel may be any value, a pressure of 5000 Pa is typically employed. Comparably, the pressure in the Differential Pump Channel may be set at any reasonable value, a pressure of about 300 Pa or less is commonly used.

The Intermediate Plate and its Sliding Seals

The preferred features and formations specific for the movable intermediate scan plate 130 are illustrated by FIGS. 12*a* and 12*b* respectively. FIG. 12*a* is a perspective view of the forward-facing surface 136 of the slideable intermediate plate 130; while in comparison, FIG. 12*b* presents a perspective view of the rearward-facing surface 138 of the single movable intermediate plate 130 present in this embodiment of the invention FIGS. 12*a* and 12*b* together show that the movable intermediate scan plate 130 includes: a planar solid body 131, a cavity zone 132 with a perimeter edge 134, a forward facing plate surface 136, and a rearward facing plate surface 138. The solid body portion 131 is subdivided into a top segment 131*a*, a bottom segment 131*b*, and two side segments 131*c* and 131*d* respectively.

The forward-facing surface view of FIG. 12*a* shows a contoured recess 172 into which three o-rings 250 and a sliding seal 210*b* can be located (as shown in cross section in FIG. 6*b*). The rearward-facing surface view of 12*b* also shows a contoured recess, numbered 171, into which a longer set of three o-rings 250 and a longer sliding seal 210*a* can be located.

The forward facing surface view of FIG. 12*a* also shows the cutouts 166 for the pinions 162, 164. In addition, a plurality of bearing cars 140, each of which is placed at one of the four corners of the intermediate plate 130, is provided to run on slide rails (not shown). Similarly, the rearward facing surface view of FIG. 12*b* also shows the cutouts 166 for the pinions 162, 164.

V. Other Information Relevant or Related to the Present Invention

The present invention, comprising a compound sliding seal unit, is intended to be used with the vacuum chamber of an ion implantation apparatus; and will provide on-demand vertical elevation and displacement of a feed-through member then extending into a closed vacuum system. This arrangement allows the means for actuating and controlling the compound sliding seal unit to be located outside the vacuum environment—that is, within the atmospheric environment of the ion implanter. Characteristically, the means for actuating and controlling the mechanism of action will include:

(i) The ability to locate electric motors and drive mechanisms outside the vacuum environment. This arrangement allows efficient lubricants to be used without compromising the vacuum environment. This also allows the motors, bearings, and the like to operate reliably for many thousands of hours.

In contrast, where such mechanisms have been of necessity located within the vacuum, the lubricants (if even permitted) must have low vapor pressure; or they will simply vaporize from the part requiring lubrication, and contaminate some other sensitive part of the equipment of related processes.

(ii) Suppose a 180 mm shaft is extended through a sliding seal mechanism into a vacuum chamber. It is desired to scan a 300 mm wafer through a 100 mm beam, requiring 400 mm of travel. An additional 50 mm is allowed for clearances and acceleration/deceleration, for a total available travel of 450 mm.

An open slot is required which is not less than 450+180=630 mm long. Moreover, the entire volume of the open slot must be surrounded by a sliding seal, which at no time over its vertical travel distance may fail to mate with the flat planar surface of an adjacently placed scan plate overlying the perimeter of the open slot.

For example, one may assume that each surrounding sealant fixture occupies 33 mm. Thus the overall distance spanning the sealant fixtures in the linear length direction of the slot must exceed 630+2*33)=696 mm.

In addition, without the use of the present invention, there is also a requirement of 450 mm of flat sealing surface which must be present at each end of the open slot; and thus the minimum linear length dimension of the fixed plate is 696+2*450=1596 mm. It is therefore impossible to locate any deep hardware such as a Faraday cup to capture unused beam within this space.

(iii) It is essential and critical to provide a deep-well Faraday cup and/or a deep beam dump within the vacuum environment to intercept the ions of the traveling beam when not striking a targeted workpiece. The Faraday cup must have a well depth adequate and sufficient to capture and contain substantially all the sputtered contaminants released from the location where the beam ions strike, in order to minimize contamination of the implanted wafer. Furthermore, a deep Faraday cup with good magnetic suppression of secondary charged particles is required in order to make for an accurate measurement of the ion beam current, for adequate control of the implanted dose.

Some conventional ion implantation equipment has been developed using a radial scan arm and a conventional sliding seal arrangement. This permits only a very shallow Faraday cup and/or beam dump, owing to the very limited space existing after the targeted workpiece has been sited into the traveling ion beam's trajectory, before space for the sliding seal is required. This conventional approach and arrangement is undesirable.

The present invention overcomes this problem by providing one movable intermediate scan plate one movable outer scan plate with a mode of action in which two sets of glide air-tight seals are created; and in which each moving plate need only travel one half of the total vertical displacement and elevation distance. Since the intermediate plate removes the need for half the sliding surface at each end of the slot, it reduces the overall height by an amount equal to the total available travel distance. Furthermore, if two intermediate plates are provided in combination with one movable outer scan plate, the sliding distance for each plate is then reduced to one third of the total distance. Clearly, the total number of intermediate plates can be increased further; and in each of these multiple intermediate plate instances, the sliding distance for each plate is then additionally reduced. It is thus possible to locate the spindle closer to the floor, to thus lower the top of the sliding seal assembly by 450 mm, and to free the space to use a properly designed Faraday cup well behind the implant position.

(iv) The compound sliding seal unit of this invention has significant advantages over conventional prior art ion devices when employed within ion implantation systems. It has been long noted that a serial-mode implantation technique is preferable to batch-mode methods for throughput considerations and reduced risk in product loss in the event of machine failure. Serial ion implantation systems also have much simpler and less expensive wafer handling systems so that development, manufacturing, and operating costs are lower than batch-mode systems.

By implementing the design and configuration of the present invention, equipment suppliers can meet the challenge of making a serial machine for implantation applications that is reliable and has competitive process control capability. Furthermore, the novel compound unit configuration will provide a superior ion implanted product for the semiconductor industry, especially those intended for low energy and 300 mm applications.

Although the present invention has been described in terms of preferred embodiments, it is understood that the disclosure provided herein is to be interpreted as neither restrictive in form nor limiting in scope. In particular, different orientations in space are not excluded by words such as 'vertical' or 'height'. Various alterations and modifications will become apparent to those skilled in the art after reading the above disclosure; accordingly, it is intended that the appended claims be interpreted as covering all alterations and modifications as fall within the true spirit and scope of the invention.

What we claim is:

1. An atmosphere to vacuum compound sliding seal unit comprising:
   a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over not less than one half of said limited length dimension;
   an intermediate plate positioned adjacent to and slideable on-demand over said forward-facing surface of said fixed inner plate, wherein said slideable intermediate plate has forward-facing and rearward-facing surfaces, prechosen width and thickness dimensions, a length dimension substantially shorter than said limited length dimension of said fixed inner plate, and a centrally disposed cavity zone whose span is substantially less than said span of said open slot in said fixed inner plate;
   an outer plate positioned adjacent to and slideable on-demand over said forward-facing surface of said slideable intermediate plate, wherein said slideable outer plate has forward-facing and rearward-facing surfaces, predetermined width and thickness dimensions, a length dimension smaller than said length dimension of said intermediate plate, and a centrally disposed air-tight mounting suitable for the juncture and support of a feed-through member;
   a first sliding seal located between said forward-facing surface of said fixed inner plate and said rearward-facing surface of said slideable intermediate plate, said first sliding seal surrounding and hermetically enclosing the perimeter of said open slot in said fixed inner plate;
   a second sliding seal located between said forward-facing surface of said slideable intermediate plate and said rearward-facing surface of said slideable outer plate, said second sliding seal surrounding and hermetically enclosing the perimeter said cavity zone in said slideable intermediate plate;
   means for raising and lowering said slideable intermediate plate and said slideable outer plate on-demand; and
   a feed-through member of set dimensions attached to said air-tight mounting of said slideable outer plate, whereby the axial length of said mounted feed-through member extends through said cavity zone of said slideable intermediate plate and said open slot of said fixed inner plate concurrently, and thereby passes from an atmospheric environment into a vacuum environment.

2. An atmosphere to vacuum compound sliding seal unit comprising:
   a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over at least one half of said limited length;
   a first intermediate plate positioned adjacent to and slideable on-demand over said forward surface of said fixed inner plate, wherein said first slideable intermediate plate has forward-facing and rearward-facing surfaces, prechosen width and thickness dimensions, a length dimension shorter than the limited length dimension of said fixed inner plate, and a first centrally disposed cavity zone whose span distance is substantially less than the span of the open slot in said fixed inner plate;
   a second intermediate plate positioned adjacent to and slideable on-demand over said forward-facing surface of said first intermediate plate, wherein said second intermediate plate has forward and rearward surfaces, prechosen width and thickness dimensions, a length shorter than said length dimension of said first intermediate plate, and a second centrally disposed cavity zone whose span size is less than the span distance of said first cavity zone in said first intermediate plate;

an outer plate positioned adjacent to and slideable on-demand over said forward-facing surface of said second slideable intermediate plate, wherein said slideable outer plate has forward-facing and rearward-facing surfaces, predetermined width and thickness dimensions, a length dimension less than the length dimension of said second slideable intermediate plate, and a centrally disposed air-tight mounting suitable for the juncture and support of a feed-through member;

a first sliding seal located between said forward-facing surface of said fixed inner plate and said rearward-facing surface of said first slideable intermediate plate, said first sliding seal surrounding and hermetically enclosing the perimeter of said open slot in said fixed inner plate;

a second sliding seal located between said forward-facing surface of said first slideable intermediate plate and said rearward-facing surface of said second slideable intermediate plate, said second sliding seal surrounding and hermetically enclosing the perimeter said cavity zone in said first slideable intermediate plate;

a third sliding seal located between said forward-facing surface of said second slideable intermediate plate and said rearward-facing surface of said slideable outer plate, said second sliding seal surrounding and hermetically enclosing the perimeter said cavity zone in said slideable intermediate plate;

means for raising and lowering each of said first and said second slideable intermediate plates and said slideable outer plate on demand; and a feed-through member of set dimensions attached to said air-tight mounting of said slideable outer plate, whereby the axial length of said mounted feed-through member extends through said cavity zone of said slideable intermediate plates and said open slot of said fixed inner plate concurrently, and thereby passes from an atmospheric environment into a vacuum environment.

3. An atmosphere to vacuum compound sliding seal unit comprising:

a fixed inner plate suitable for immovable attachment to and integration with a wall of a vacuum chamber, wherein said fixed inner plate has forward-facing and rearward-facing surfaces, preselected width and thickness dimensions, a limited length dimension, and a centrally disposed open slot whose span extends over at least one half of said limited length dimension;

at least two discrete intermediate plates individually positioned adjacent to and slideable on-demand over said fixed inner plate, wherein each of said slideable intermediate plates has forward-facing and rearward-facing surfaces, prechosen width and thickness dimensions, a length dimension shorter than the limited length dimension of said fixed inner plate, and a centrally disposed cavity zone whose span distance is not greater than fifty percent of the span of said open slot in said fixed inner plate;

an outer plate positioned adjacent to and slideable on-demand over a forward facing surface of the last of said discrete slideable intermediate plates, wherein said slideable outer plate has forward and rearward facing surfaces, predetermined width and thickness dimensions, a length dimension less than the smallest length dimension of said slideable intermediate plates, and a centrally disposed air-tight mounting suitable for the juncture and support of a feed-through member;

a first sliding seal located between said forward-facing surface of said fixed inner plate and said rearward-facing surface of the most rearwardly placed of said slideable intermediate plates, said first sliding seal surrounding and hermetically enclosing the perimeter of said open slot in said fixed inner plate;

a plurality of additional sliding seals which are located between said forward-facing surface for each of said slideable intermediate plates and a reward facing surface of a successive plate up to and including said outer plate wherein each of said additional sliding seals surrounds and hermetically encloses the individual perimeter of each said cavity zone in each of said slideable intermediate plates;

means for raising and lowering each of said slideable intermediate plates and said slideable outer plate on-demand; and a feed-through member of set dimensions attached to said air-tight mounting of said slideable outer plate, whereby the axial length of said mounted feed-through member extends through each of said cavity zones in said slideable intermediate plates and said open slot of said fixed inner plate concurrently, and thereby passes from an atmospheric environment into a vacuum environment.

4. The apparatus of claim 1, 2, or 3 wherein said feed-through member is rotatable on demand.

5. The atmosphere to vacuum compound sliding seal unit as recited in claim 1, 2, or 3 further comprising an actuating mechanism to translate said feed-through member vertically over a predetermined distance.

6. The atmosphere to vacuum compound sliding seal unit as recited in claim 1, 2, or 3 further comprising a motion control system arranged to coordinate vertical movement between said slideable plates.

7. The atmosphere to vacuum compound sliding seal unit as recited in claim 1, 2, or 3 wherein said means for vertically sliding each of said slideable intermediate plates and said slideable outer plate upwards and downwards on-demand comprises a double rack and pinion arrangement disposed between said plates.

8. The atmosphere to vacuum compound sliding seal unit as recited in claim 1, 2, or 3 wherein each of said sliding seals is an O-ring.

9. The atmosphere to vacuum compound sliding seal unit as recited in claim 1, 2, or 3 wherein each of said sliding seals is a one piece preformed construct.

10. The atmosphere to vacuum compound sliding seal unit as recited in claim 1, 2, or 3 wherein each of said sliding seals is a one piece preformed construct.

11. The atmosphere to vacuum compound sliding seal unit as recited in claim 1, 2, or 3 or 10 further comprises means for performing differential vacuum pumping on demand.

12. The atmosphere to vacuum compound sliding seal unit as recited in claim 11 wherein said means for performing differential vacuum pumping on-demand comprises:

a rough differential pump channel arranged as a series of apertures which are annularly placed around the perimeter of said open slot of said fixed and immovable inner plate; and a differential pump channel arranged as a series of perforations which are annularly positioned around the perimeter of said open slot of said fixed and immovable inner plate and which lie substantially in parallel with said series of apertures constituting said rough differential pump channel.

13. The atmosphere to vacuum compound sliding seal unit as recited in claim 12 wherein said sliding seal then disposed upon said rearward facing surface of any of said plates further comprises two discrete internal vacuum pumping conduit systems, one of which is in individual air-tight communication with said rough differential pump channel and the other of which is in individual air-tight communication with said differential pump channel; and two discrete open connector ports, one of which is in individual air-tight communication with said internal vacuum pumping conduit system for said rough differential pump channel, and the second of which is in individual air-tight communication with said internal vacuum pumping conduit system for said differential pump channel.

14. The atmosphere to vacuum compound sliding seal unit as recited in claim 11 wherein a discrete vacuum pumping hose is joined hermetically to each of said two open connector ports.

15. The atmosphere to vacuum compound sliding seal unit as recited in claim 11 wherein the vacuum pressure within said rough differential pump channel is greater than the vacuum pressure within said differential pump channel.

16. The atmosphere to vacuum compound sliding seal unit as recited in claim 1, 2, 3, or 10 wherein said feed-through member is vertically raised and lowered at will to lie adjacent to and parallel with the trajectory of a traveling ion beam within the vacuum environment.

17. The atmosphere to vacuum compound sliding seal unit as recited in claim 1, 2, or 3 or 10 wherein a pivotal radial arm translation apparatus is attached to the axial end of said feed-through member then present within the vacuum environment.

18. The atmosphere to vacuum compound sliding seal unit as recited in claim 17 wherein said pivotal radial arm translation apparatus comprises:

means for on-demand pivoting of said radial arm within said vacuum environment;

means for at will passing said radial arm repeatedly in two directions through the trajectory of an ion beam then traveling within said vacuum environment; and an electrostatic chuck for holding a target workpiece on said radial arm.

19. The atmosphere to vacuum compound sliding seal unit as recited in claim 17 wherein the elevation of said pivotal radial arm is adjusted on-demand by an electric motor.

20. A unitary sliding seal arrangement suitable for use between a region of high pressure and a region of vacuum, said unitary sliding seal arrangement comprising:

a preformed sealant article formed of slightly flexible, low friction material having good sealing and wear-resistance properties which can be interposed between a first plate and a second plate that can be moved relative to one another; and which can be nested in a recess on a surface of the first plate that bears against a surface of the second plate, wherein said sealant article (i) incorporates a plurality of annular flat sealing surfaces between which annular recesses are provided, said recesses being capable of connection to a source of differential pumping, (ii) bridges each recess and allows each of the annular sealing surfaces some independence of motion when sliding over such imperfections and deviations as then exist upon the surface of the second plate, and (iii) is urged against the second plate to form a plurality of substantially air-tight closures by means of each said annular flat sealing surface, (iv) allows said source of differential pumping to be applied between each said air-tight closure, and thereby allows reliable effective dynamic sealing between atmospheric pressure and high vacuum between surfaces in relative motion.

21. The unitary sliding seal arrangement of claim 20 wherein said preformed sealant article will encompass a feed-through member then extending through said plates from the region of high pressure to the region of vacuum.

* * * * *